United States Patent
Shin et al.

[11] Patent Number: 6,150,709
[45] Date of Patent: Nov. 21, 2000

[54] GRID ARRAY TYPE LEAD FRAME HAVING LEAD ENDS IN DIFFERENT PLANES

[75] Inventors: Won Sun Shin; Byung Joon Han; Ju Hoon Yoon, all of Seoul; Sung Bum Kwak, Kyungki-Do; In Gyu Han, Seoul, all of Rep. of Korea

[73] Assignees: Anam Semiconductor Inc., Seoul, Rep. of Korea; Amkor Technology, Inc., Chandler, Ariz.

[21] Appl. No.: 09/203,720

[22] Filed: Dec. 1, 1998

Related U.S. Application Data

[62] Division of application No. 08/775,839, Dec. 31, 1996, Pat. No. 5,866,939.

[30] Foreign Application Priority Data

| | | | |
|---|---|---|---|
| Jun. 21, 1996 | [KR] | Rep. of Korea | 96-22897 |
| Jun. 21, 1996 | [KR] | Rep. of Korea | 96-22898 |
| Jun. 21, 1996 | [KR] | Rep. of Korea | 96-22899 |

[51] Int. Cl.[7] .................................. H01L 23/495
[52] U.S. Cl. .............................. 257/666; 257/692
[58] Field of Search ................... 257/666, 692, 257/778, 787

[56] References Cited

U.S. PATENT DOCUMENTS

| | | | |
|---|---|---|---|
| 5,363,279 | 11/1994 | Cha | 361/767 |
| 5,428,248 | 6/1995 | Cha | 257/676 |
| 5,436,492 | 7/1995 | Yamanaka | 257/666 |
| 5,519,251 | 5/1996 | Sato et al. | 257/778 |
| 5,684,330 | 11/1997 | Lee | 257/778 |

OTHER PUBLICATIONS

Japanese Publication No. 94–53399 entitled "Resin–Sealed Semiconductor Device" (abstract only).

Japanese Publication No. 94–97349 entitled "Resin–Sealed Semiconductor Device and Production Thereof" (abstract only).

Japanese Publication No. 93–2528585 entitled "IC Module" (abstract only).

*Primary Examiner*—Roy Potter
*Attorney, Agent, or Firm*—Skjerven Morrill MacPherson LLP; Don C. Lawrence

[57] ABSTRACT

The invention relates to a grid array type lead frame having a plurality of leads classified into groups by length. The leads extend to respective lead ends, in each of which at least one different plane direction-converting lead part and/or at least one identical plane direction-converting lead part is formed by at least one bending part, whereby the lead ends are distributed in a grid array. The invention also includes a grid array type lead frame, which is as small as or similar to that of semiconductor chip in area while the lead ends are arrayed on one plane, and are at a farther distance away from neighboring ones but in a higher number per area, in such a manner that they form a grid array.

34 Claims, 15 Drawing Sheets

GRID ARRAY TYPE LEAD FRAME HAVING LEAD ENDS IN DIFFERENT PLANES

RELATED APPLICATIONS

This is a divisional of application Ser. No. 08/775,839, filed Dec. 31, 1996, now U.S. Pat. No. 5,866,939.

BACKGROUND OF THE INVENTION

1. Field of the Invention

The present invention relates to a grid array type frame. More particularly, the present relates to a grid array type lead frame having a plurality of leads classified into groups by length, in each of which at least one different plane direction-converting lead part and/or at least one identical plane direction-converting part is formed by at least one bending part, thereby distributing lead ends in a grid array. A grid array semiconductor package employing the same is as small as or similar to that of a semiconductor chip in area while a plurality of leads extend to lead ends which are arrayed on one plane, a farther distance away from neighboring ones but in a higher number per area, in such a manner that they form a grid array.

2. Description of the Prior Art

To encapsulate semiconductor chips and their peripheral parts with plastics such as epoxy resins with the aim protecting them from external environment is of relatively low cost as well as of high efficiency. By virtue of these advantages, such encapsulation is widely applied in quad flat semiconductor packages, which have leads extending from the same plane in all four side directions and in ball grid array semiconductor packages, which utilize solder balls as input and output ends.

However, such a conventional quad flat semiconductor package is difficult to reduce in size because the leads are in the same plane as the plastic encapsulating part and extend from the four sides of the package to its exterior. In addition, the high integration of semiconductor chips requires an exceptionally increased number of pins the distance between which has been technically difficult to narrow to a certain value. Thus, to accommodate such a large number of pins, a large-sized package is necessary, which results in retrogradation against the tendency toward the small size of semiconductor packages.

In an effort to solve such a multi-pin problem, there has been suggested a ball grid array semiconductor package that utilizes as input and output ends a plurality of solder balls fused into the bottom of a substrate. Not only can the ball grid array semiconductor package accommodate far more numbers of input and output signals, but can be smaller in size than the quad flat semiconductor package.

In spite of these advantage, there has still been a significant limit in the reduction of the size of the ball grid array semiconductor package because the circuit board used is far larger than the semiconductor chip. In addition, the circuit board is so expensive that the price of the product could be adversely affected.

In U.S. Pat. No. 5,363,279 a semiconductor package having a decreased package area is disclosed in which the leads electrically connected with the semiconductor chips do not extend to the side of the package but are introduced to the package bottom below the semiconductor chip mounting area, as shown in FIGS. 22A and 22B. In FIG. 22A, a schematic cross section is shown for a package 100 of such a conventional lead frame having a plurality of double-bent leads 102 lining up in a double file with the same length, a semiconductor chip 120 attached to a non-bent area of the leads 102 by an adhesive means 150, bond wires 130 electrically connecting the leads 102 with the semiconductor chip 120, and an encapsulating part 140 for protecting the above-mentioned elements from the external environment. For the miniaturization of the package 100, the ends 104 of the bent leads 102 are arrayed in two rows on the bottom of the encapsulating part 140 below a semiconductor chip-mounting area without projecting them externally.

FIG. 22B shows the bottom of the package 100 on which the lead ends 104 are exposed lining up in a double file. This structure successfully provides for miniaturization to the package 100 but has a serious problem in that the number of the leads playing as input and output ends is rather fewer than that of the leads in the conventional quad semiconductor package. If the number of the exposed lead ends 104 arrayed in two rows is increased per area, then when the package is mounted on a mother board (not shown) by soldering a package defect would be highly apt to occur wherein the resulting narrow distance between the neighboring lead ends leads to either a short circuit or a signal interference to which a noise is attributed, resulting in the difficulty transmitting signals at high speed. Thence, it is virtually difficult to increase the number of the exposed lead ends 104 in the conventional package 100.

Japanese Patent Laid-Open Publication No. 6-53399 discloses a semiconductor device encapsulated in a resin, which comprises a plurality of leads bent in a U form. This is shown in FIG. 23A. As shown, leads 202 all extend to all four side directions of a semiconductor chip and the lower part of each of them is exposed on the bottom of a resin encapsulating part. FIG. 23B is a bottom view of a package 200 of FIG. 23A. As seen in FIG. 23B, the leads 202 are arrayed in a line along the four sides of the package at the outside of the chip mounting area, totally forming a square. The miniaturization of the package 200 as well as the increase in the number of the exposed lead ends 202 per area is impossible to realize in practice.

SUMMARY OF THE INVENTION

Therefore, it is an objective of the present invention to provide a grid array type lead frame in which the package area is reduced similar to the size of a semiconductor chip while the exposed lead ends used as input and output ends are increased in the number per area.

It is another objective of the present invention to provide a grid array type lead frame in which the exposed lead ends with an increased number per area are farther distant from each other while the package area is reduced similar to the size of a semiconductor chip.

It is a further objective of the present invention to provide a grid array type lead frame in which, while the exposed lead ends used as input and output ends are increased in the number per area, the noise attributable to the signal interference resulting from the approximation between the leads is significantly reduced, whereby smooth signal transmission can be run at a high speed.

In accordance with a first aspect of the present invention, there is provided a grid array type lead frame, comprising a side rail, a plurality of leads supported by the side rail and classified into at least two groups by length, at least one different plane direction-converting lead part formed in each of the leads by at least one bending part, and a plurality of lead ends to which the leads extend, said lead ends being located on one lower plane corresponding to a semiconductor chip-mounting region, with formation of a grid array which is designed to be exposed out of a bottom region of a plastic encapsulant part.

In accordance with a second aspect of the present invention, there is provided a grid array type lead frame in which a line of the lead ends and a row of the lead ends alternate with neighboring ones, forming a grid array.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1A:
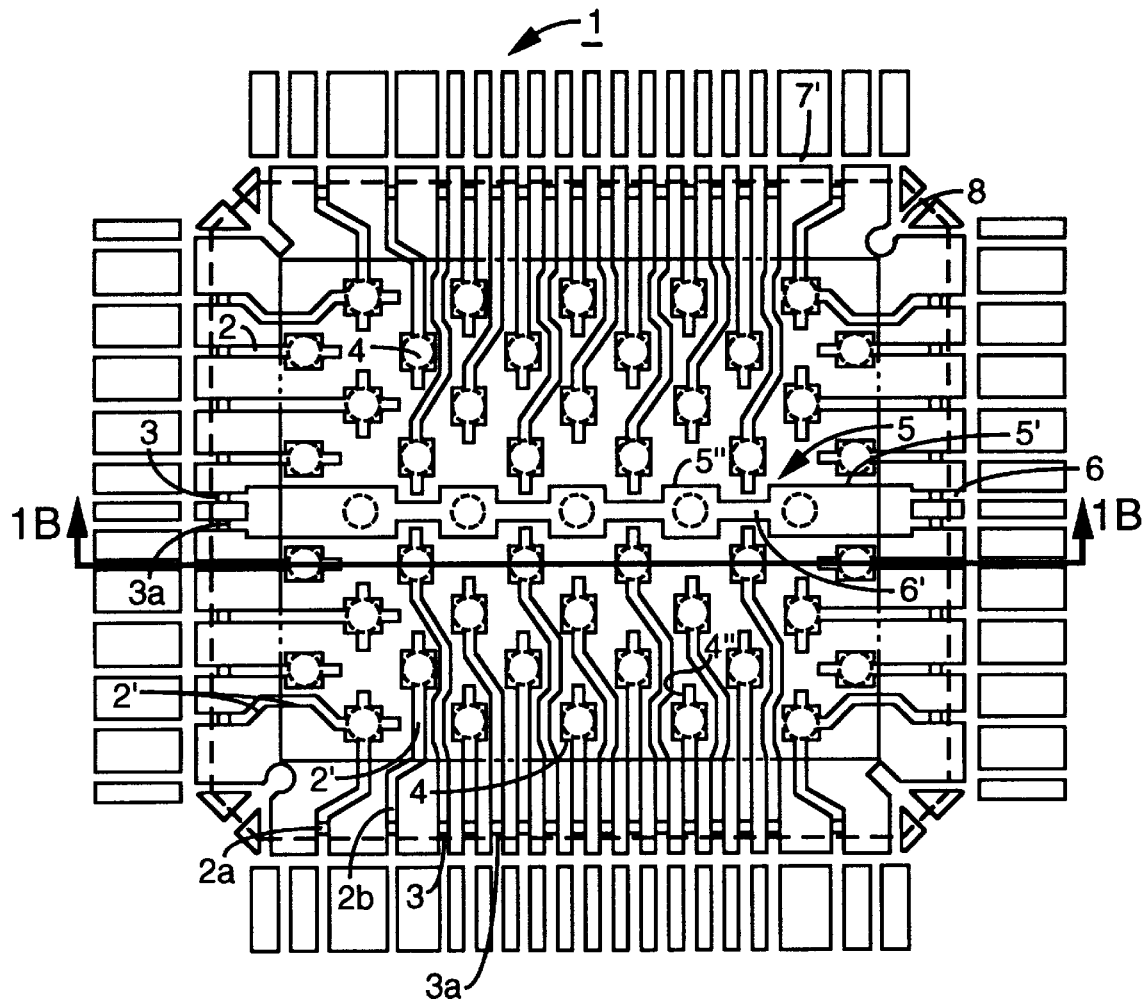
FIG. 1A is a schematic plan view showing a grid array type lead frame according to a first preferred embodiment of the present invention.

The application of the preferred embodiments of the present invention is best understood with reference to the accompanying drawings, wherein like reference numerals are used for like and corresponding parts, respectively.

In plan views of the drawings, the term "X axis" as used herein stands for the crosswise direction, the term "Y axis" as used herein for the lengthwise direction, and the term "Z axis" as used herein for the perpendicular direction to both the X axis and the Y axis. In cross sectional views of the drawings, the term "X axis" as used herein stands for the crosswise direction, the term "Y axis" as used herein for the direction perpendicular to the plane of the paper and the term "Z axis" as used herein for the lengthwise direction.

The term "grid array" as generally used herein means that lead ends or lead end prominences are arrayed in at least three rows and at least three columns when a row and/or a column alternating, in part or total, with its neighboring ones is included.

Figure 1B:
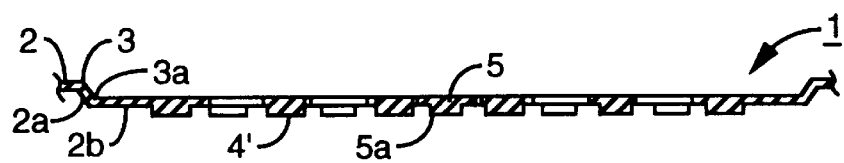
FIG. 1B is a schematic cross sectional view of the lead frame, taken along the line 1B—1B of FIG. 1A.

Referring to FIG. 1A, there is shown a grid array type lead frame 1 in a plan view, according to a first preferred embodiment of the present invention. FIG. 1B is a cross sectional view of the lead frame, taken along the line 1B—1B of FIG. 1A. For the sake of convenience these figures will be taken for the description of the first preferred embodiment, simultaneously.

The grid array type lead frame 1 has a plurality of leads 2 which are grouped by length, all being perpendicularly connected to and supported by a dambar 7' and a side rail (not shown, formed beside the dambar 7) and extending, in X axis or Y axis, to the central area of the frame. In each of the leads 2, there are formed two direction-converting lead parts 2a and 2b which are each introduced into different planes by a first and a second bending parts 3 and 3a, respectively. Hereinafter, such a direction-converting lead part into different planes is referred to as "different plane direction converting lead part." At least one direction-converting lead part 2' on the same plane may be formed in at least one of the lead groups (hereinafter, the direction-converting lead part on the same plane is referred to as "identical plane direction-converting lead part"). In addition, at a terminal region of the lead extending to the central area, there is formed a square lead end 4 which is wider than the lead itself.

In greater detail, all of the leads 2 extending, in X axis, to the central area of the frame 1, have a different plane direction-converting lead part 2a slant bent to XZ axis by the first bending part 3 and a different plane direction-converting lead part 2b bent to X axis, the same direction as prior to bending, by the second bending part 3a (see FIG. 1B). Similarly, all of the leads 2 extending, in Y axis, to the central area of the frame 1, have a different plane direction converting lead part 2a slant bent to YZ axis by the first bending part 3 and a different plane direction-converting lead part 2b bent to Y axis, the same direction as prior to bending, by the second bending part 3a. Being at the same distance away from the dambar 7', the first bending parts 3 formed on all of the leads 2 are in contact with the inside of a plastic encapsulating region (represented by dotted lines). The leads 2 are slant bent downwardly by the first bending parts 3 and then extend to the same direction as before the first bending with the aid of the second bending parts 3a which are near the first bending parts at the same distance away from the dambar 7' Consequently, the leads 2 each are bent to X axis and/or Y axis, and Z axis directions, extending below the semiconductor chip mounting area (represented by double dotted lines).

In FIG. 1A, the leads 2 extending to X axis direction have no identical plane direction-converting lead parts 2' except for the leads in close contact with the corner of the package (they each have two or four identical plane direction converting lead parts 2'). In contrast, in the leads 2 extending to Y axis direction, those that have no identical plane direction-converting lead parts and those that have 2 or 6 identical plane direction-converting lead parts alternate. At each corner, two leads 2 form one lead end 4. Of course, the above-illustrated bending and array type is optional and thus may be modified if necessary.

Therefore, the leads all are bent to two directions of X and Z axes or Y and Z axes or to three directions of X, Y and Z axes, extending to the same plane below the semiconductor chip-mounting area. This results in the formation of a grid array.

As mentioned above, the lead ends 4 each are located at predetermined positions on the same plane below the semiconductor chip-mounting region (represented by double dotted lines), forming a grid array of alternating rows and lines. In the frame of FIG. 1, the leads groups different from each other in length are 8 groups (2 groups extending to X axis direction, 4 groups extending to Y axis direction and 2 groups extending to the lead ends at the corners). In the view of the lead ends, a grid array consists of 8 alternating lines (the fourth and the fifth lines are symmetric) and 11 alternating rows.

A lead end tip 4" is formed beside at least one side of the lead end 4 including the side to the direction of which the lead extends. The lead end tip 4" may also be formed beside the other side of the lead end 4 but not beside the side to which the lead 2 is integrated. The lead end tip 4" plays a role of firmly fixing the lead end 4 within a plastic encapsulating part (not shown) which is formed by molding when a semiconductor package is fabricated by use of the grid array type lead frame 1.

At the bottom of the lead end 4, a cylindrical lead end prominence 4' is formed by etching (circle part represented by dotted lines within the lead end 4 in FIG. 1A). This lead end prominence 4' is used as an input and output terminal after completion of the semiconductor package fabrication.

A semiconductor chip (not shown) is attached to a semiconductor chip pad 5 by means of an adhesive such as epoxy resin or adhesive tape. The regions represented by dotted lines within the pad 5 will be cut out after formation of plastic encapsulating parts. The semiconductor chip pad 5 consists of two rectangular chip pads 5' which are positioned at the left and the right sides of the grid array type lead frame and three square chip pads 5" which are located at the central area. The pads all are supported in a line by a member 6' The two rectangular chip pads 5' are supported to the dambar 7' through two separate tie bars which are bent by the first and the second bending parts 3 and 3a in the same patterns as the case of the leads 2. Below the chip pads 5' and 5", cylindrical prominences 5a (the circular regions represented by dotted lines within the chip pads 5' and 5" in FIG. 1A) are formed on the same plane with the lead end prominences 4' Therefore, since the cylindrical prominences 5a become exposed to the exterior of the plastic encapsulating parts (not shown) after the fabrication of the semiconductor package, heat generated during the operation of the semiconductor chip is emitted efficiently through the prominences 5a to the exterior. It is a matter of course that such shape and array of the chip pad 5 may be modified if necessary.

Figure 2:
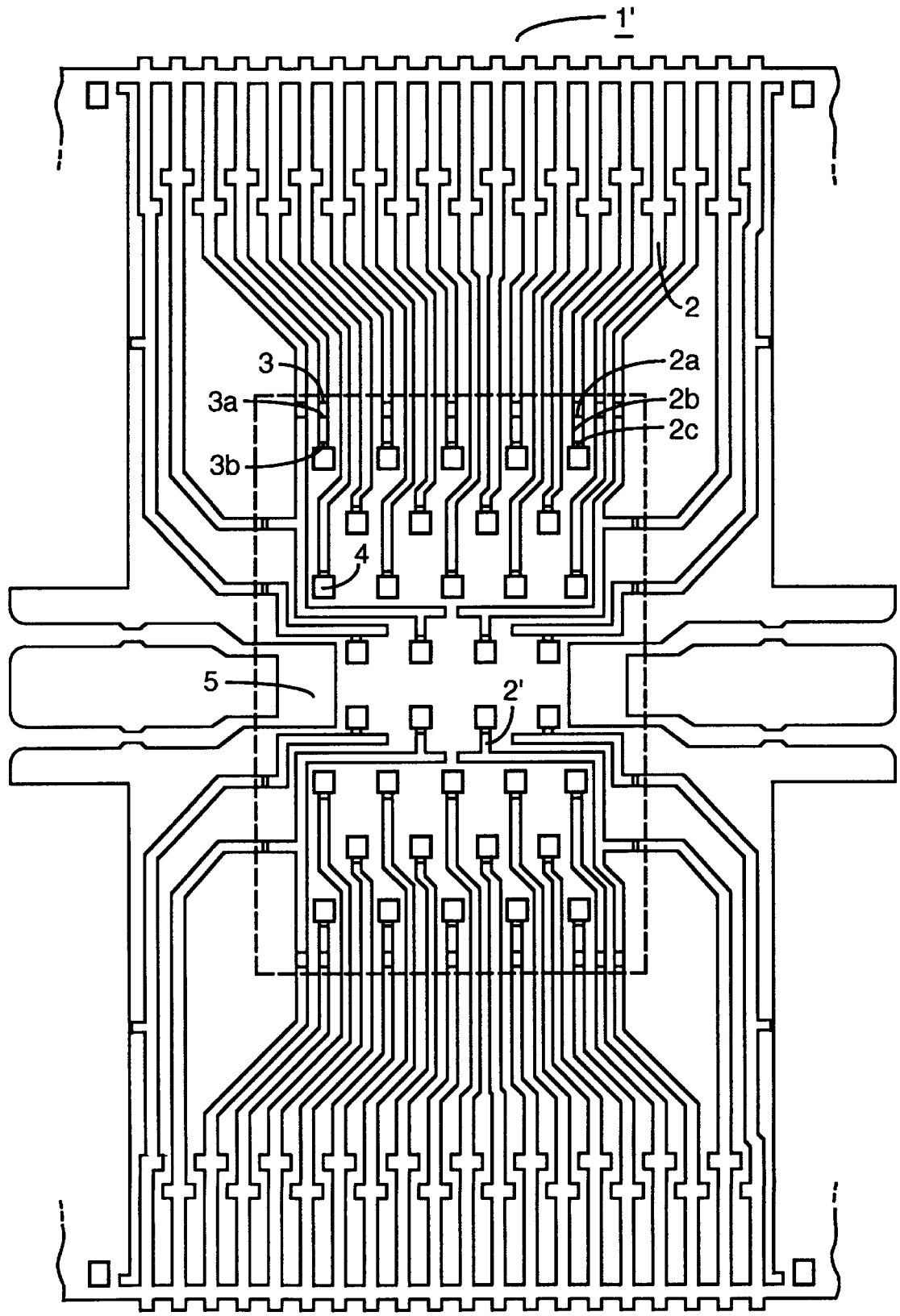
FIG. 2 is a schematic plan view showing a grid array type lead frame according to a second preferred embodiment of the present invention.

At the four corners of the grid array type lead frame 1 of the present invention, guides 8 are formed in order to introduce a liquid of encapsulating resin which will be molded into the plastic encapsulating parts upon fabrication of semiconductor package. Since any bending parts are not formed in the guides 8, they are located on the same plane with the dambar 7'. The shape of the guides 8 may be modified as necessary. Referring to FIG. 2, there is a plane view showing a grid array type lead frame 1' according to a second embodiment of the present invention. The grid array type lead frame 1' has a plurality of leads 2 classified into at least two groups by length. The leads 2 extending, in Y axis, to the central area of the frame 1' each have at least one identical plane direction-converting lead part 2' and at least one different plane direction-converting lead part 2a–2c which is bent by at least one bending part 3, 3a–Jc. Therefore, the leads 2 can be extended to any direction of X, Y and Z axes by the converting lead parts and are terminated at lead ends 4 which are located on the same plane below a central semiconductor chip mounting region (represented by dotted lines), forming a grid array.

In more detail, in FIG. 2, the leads 2 all basically extend to Y axis direction and there are six lead groups different from each other in length (of them, the leads subject to two groups extend to one lead end). The identical plane direction-converting lead part 2' converts the lead to at least one direction selected from XY axis (that is, slant extends on the XY plane), X axis, or Y axis. There may be present 2, 4 or 6 identical plane direction-converting lead parts 2' in each of the leads. Thus, in the view of the lead ends, the grid array consists of 8 alternating lines (the fourth and the fifth lines are symmetric) and 9 partially alternating rows.

By means of an adhesive such as epoxy resin and an adhesive tape, a semiconductor chip (not shown) is attached on chip pads 5 which are located at the left and the right sides of the frame, a smaller in size than that of the chip. The regions represented by dotted lines will be cut out after formation of plastic encapsulating parts.

Thus far, while the grid array type lead frames 1 and 1' have been described which are presently believed to be the first and the second embodiments of the present invention respectively, the present invention is not limited to them. Thus, the number of the bending parts 3n formed in the leads is set to be the same or different throughout the lead groups, in part or in total. Also, the number of the bending parts 3n in the leads subject to one lead group may be the same or different in total or in part. This is optional. When the identical plane direction-converting lead parts 2' are formed in at least two lead groups, their number is set to be the same or different throughout the lead groups, in part or in total. Likely, the number of the identical plane direction-converting lead parts 2' in the leads 2 subject to one lead group may be the same or different in total or in part. This is also optional.

Accordingly, the leads 2 all are bent to two directions of X and Z axes or Y and Z axes or to three directions of X, Y and Z axes, extending to the same plane below the semiconductor chip-mounting area. Therefore, so far as the identical plane direction-converting lead parts 2' formed in the leads 2 convert themselves to XY axis direction, X axis direction or Y axis direction once or many times, extending to the same plane below the semiconductor chip-mounting area, the resulting grid array on the same plane is within the scope of the present A better understanding of the present invention may be obtained in light of another preferred embodiment which is set forth to illustrate, but are not to be construed to limit, the present invention.

Figure 3:
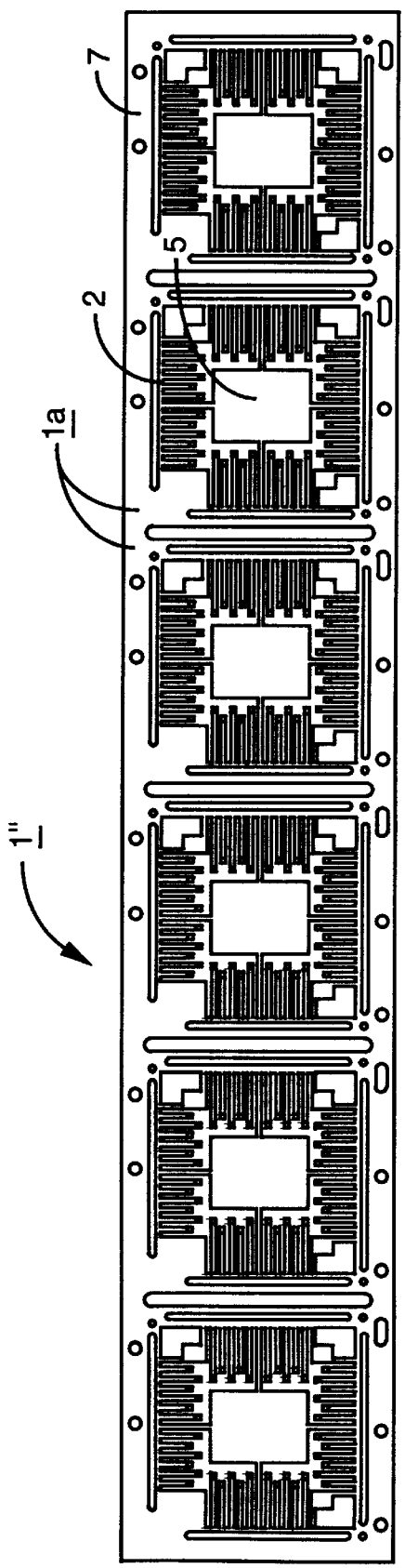
FIG. 3 is a schematic plan view showing a grid array type lead frame strip according to a third preferred embodiment of the present invention.

FIG. 3 is a plan view showing a strip 1" consisting of six sheets of grid array type unit lead frames 1a, according to a third embodiment of the present invention. As shown in FIG. 3, the unit frame 1a each comprising a chip pad 5 located on the central area smaller in size than that of a semiconductor chip to be mounted, a plurality of leads located at the peripheral sides of the chip pad 5, and a side rail for supporting the leads 2. Such strip 1" is efficiently used in a process of fabricating the package 1a.

Figure 4:
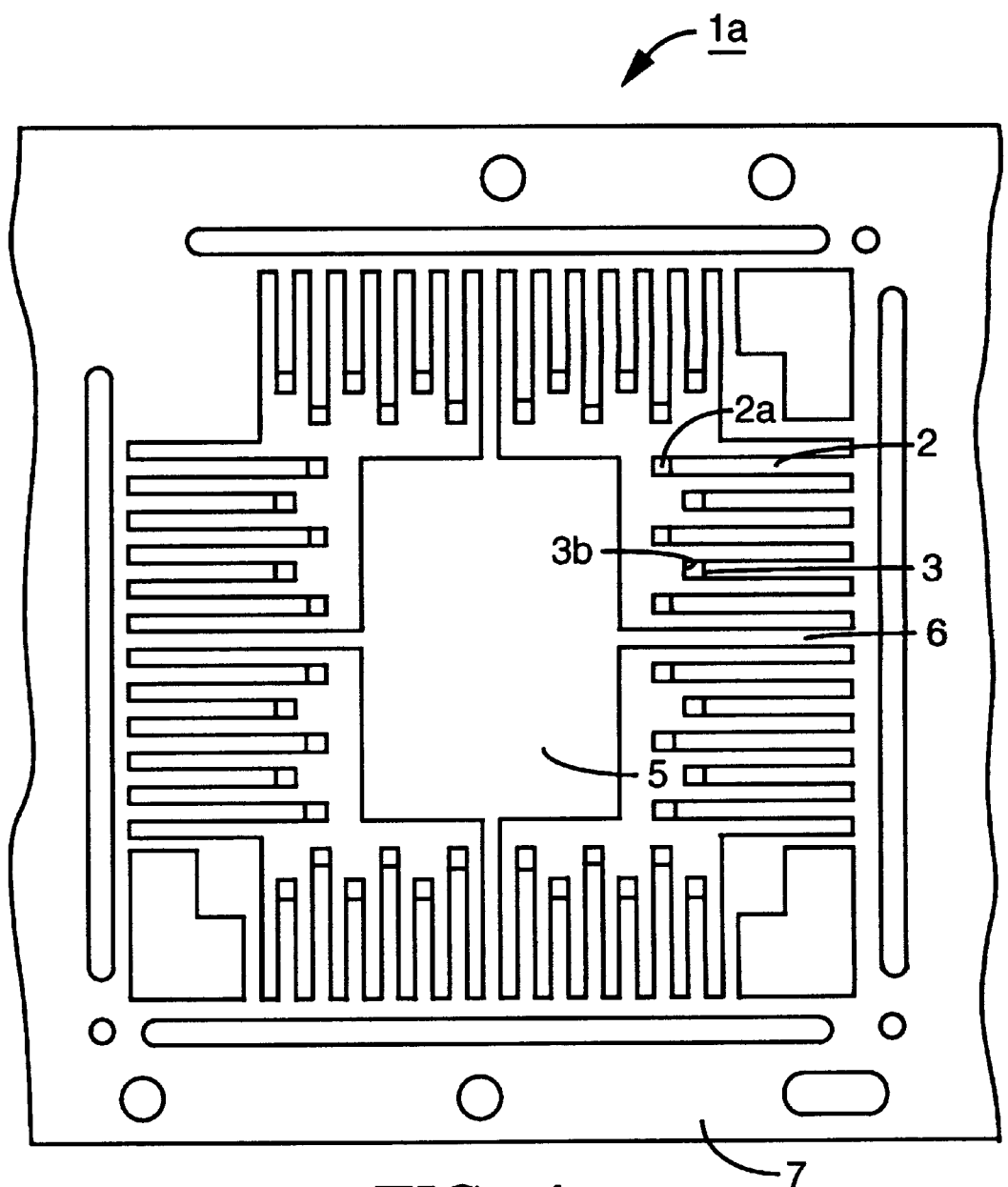
FIG. 4 is a schematic plan view showing a unit frame of the strip of FIG. 3.

FIG. 4 is an expanded plane view showing a unit frame 1a of the strip 1" of FIG. 3. This will be described in detail and better understood if referring to the description for the frame of FIGS. 7A and 7B.

The grid array type lead frame 1a according to the third embodiment has a central chip pad 5 smaller in size than a semiconductor chip, tie bars for supporting the chip pad 5, and a plurality of leads 2 classified into at least two groups by length. Extending from four sides to the chip pad 5 on the same plane with the frame 1a, the leads 2 each have three direction-converting lead parts 2a and 2b (2b is not shown) which are introduced into three different planes by a first bending part 3, a second bending part 3a (not shown) and a third bending part 3b, respectively (the final different plane direction-converting lead part is a lead end (not shown)). While the leads 2 which extend in X axis are bent only to X axis or Z axis direction, the leads 2 which extend in Y axis are bent only to Y axis or Z axis direction until the leads 2 all reach the areas which are on the same plane below the semiconductor chip-mounting region except for the chip pad 5.

In more detail, the leads 2 are classified into two groups by length, each being alternately arranged, and no identical plane direction-converting lead part is present in the leads. The leads 2 extending to X axis direction are sequentially bent to Z axis downward direction, to X axis direction and then to Z axis downward direction by the first, the second and the third bending parts 3, 3a and 3b, respectively, to form steps. Similarly, the leads 2 extending to Y axis direction are sequentially bent to Z axis downward direction, to Y axis direction and to Z axis downward direction by the three bending parts 3, 3a and 3b, respectively, to form steps.

The leads are terminated at lead ends (not shown) each of which are located at predetermined positions on the same plane below the frame 1a, so that a grid array consisting of partially alternating rows and lines appears on the plane. Thus, in the view of the lead ends, the grid array consists of 14 partially alternating lines and 12 partially alternating rows, as shown in FIG. 4.

Figure 5A:
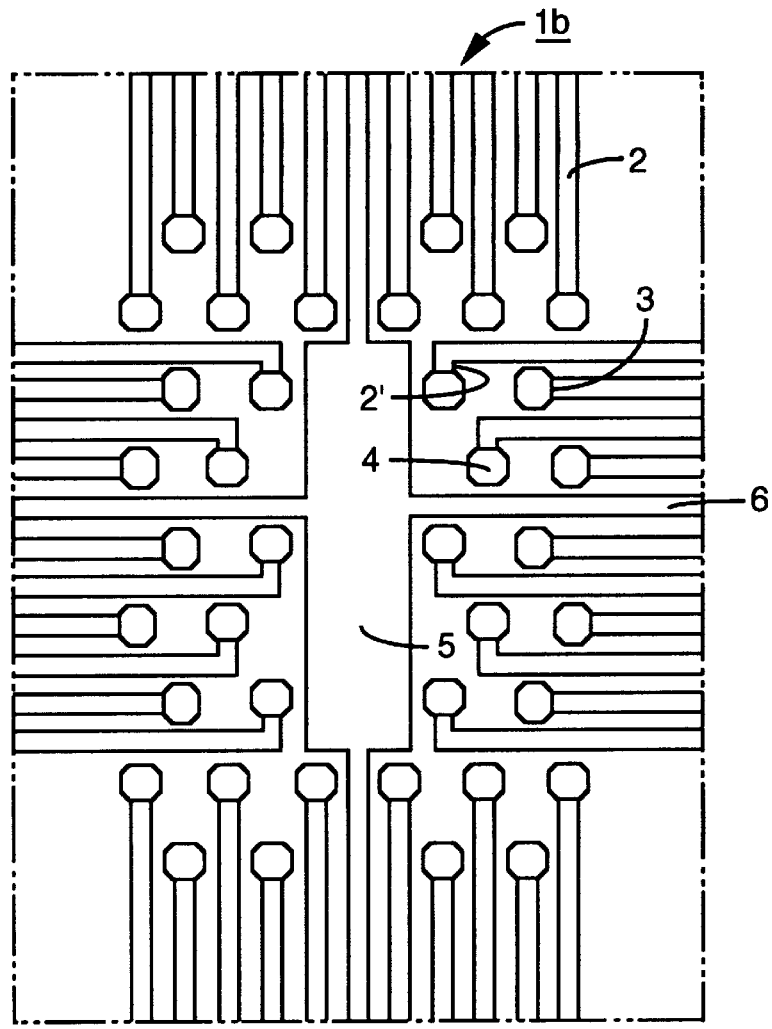
FIG. 5A is a schematic partial plan view showing a grid array type lead frame according to a fourth preferred embodiment of the present invention.

FIG. 5A shows a grid array type lead frame 1b according to a fourth embodiment of the present invention in a schematic plane view in which a region used for the semiconductor package is defined by the outer line along which cutting is to be performed after the fabrication of the semiconductor package.

Figure 5B:
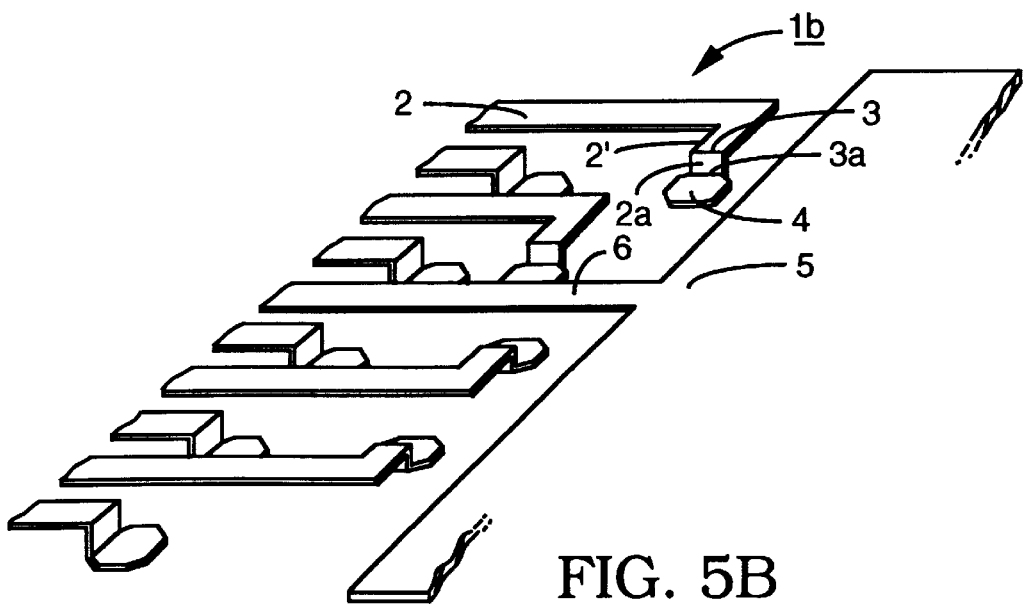
FIG. 5B is a schematic perspective view of FIG. 5A.

FIG. 5B is a schematic partial perspective view showing the left portion of FIG. 5A. A description will be given below of the grid array type lead frame 1b in conjunction with both FIGS. 5A and 5B for the sake of convenience.

The frame 1b according to the fourth embodiment of the present invention has a semiconductor chip pad 5 supported to side rails by tie bars 6, and a plurality of leads classified into 6 groups by length, which extend from four sides to the direction of the chip pad 5.

Of the six lead groups, two with different lengths are directed to Y axis. The leads subject to these two groups are arranged alternately and perpendicularly bent to Z axis downward direction by first bending parts 3 to created different plane direction-converting lead parts 2a which are, then, perpendicularly bent to Y axis direction by second bending parts 3a. The extension of the leads is terminated at lead ends 4 which are parallel to the lead frame and are formed into expanded parts, which contribute to the ease of connection with a mother board (not shown), as shown in FIG. 5B.

Being alternately arranged, the remaining four lead groups, each having a predetermined different length, are directed to X axis. Of them, two groups are relatively longer groups the leads of which have identical plane direction-converting lead parts 2'. Whereas, no identical plane direction-converting lead parts are found in the leads subject to the other two groups, relatively shorter groups. The leads 2 having no identical plane direction-converting lead part 2' are similar to those extending to X direction in FIG. 5A except that the leads 2 are perpendicularly bent to Z axis downward direction to form different plane direction converting lead parts 3a which are, in turn, perpendicularly bent to X axis direction to form lead ends 4 (see FIG. 5B). The leads subject to the other two groups are bent on the same plane, that is, to Y axis to create the identical plane direction-converting lead parts 2', then perpendicularly to Z axis downward direction by first bending parts to form different plane direction-converting lead parts 2a, and finally perpendicularly to Y axis by second bending parts 3a to form lead ends 4, as shown in FIG. 5B.

Thus, the extension of the leads are terminated at the lead ends 4 which each are located at predetermined positions on the same plane below the semiconductor chip-mounting region except for the chip pad 5, so that a grid array consisting of nine alternating lines and ten alternating rows (the fourth and the seventh rows are symmetric reciprocally) is constructed in view of the lead ends.

Figure 5C:
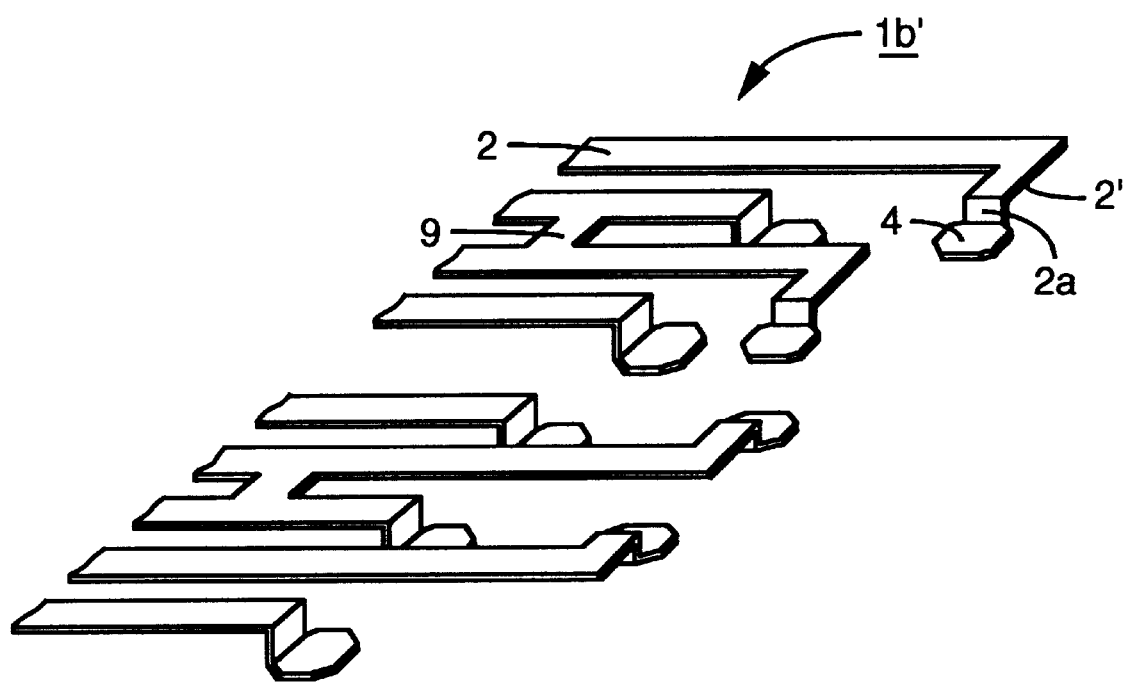
FIG. 5C is a schematic partial perspective view showing a modification of the fourth embodiment.

FIG. 5C shows a modification of the fourth embodiment in a schematic partial perspective view. This modification has a similar structure to that of the fourth embodiment except that two leads are connected with each other through a lead connecting part 9. The number and position of the lead connecting part 9 can be selected optionally according to necessity. Therefore, power signal or ground can be shared by a desired number of the leads 2 by virtue of one wire bonding or bump connection. In addition, since no semiconductor chip pad supported by a tie bar is present in this modification, a semiconductor chip is directly mounted on a suitably selected number of leads 2. Of course, such modification is optional.

Figure 6A:
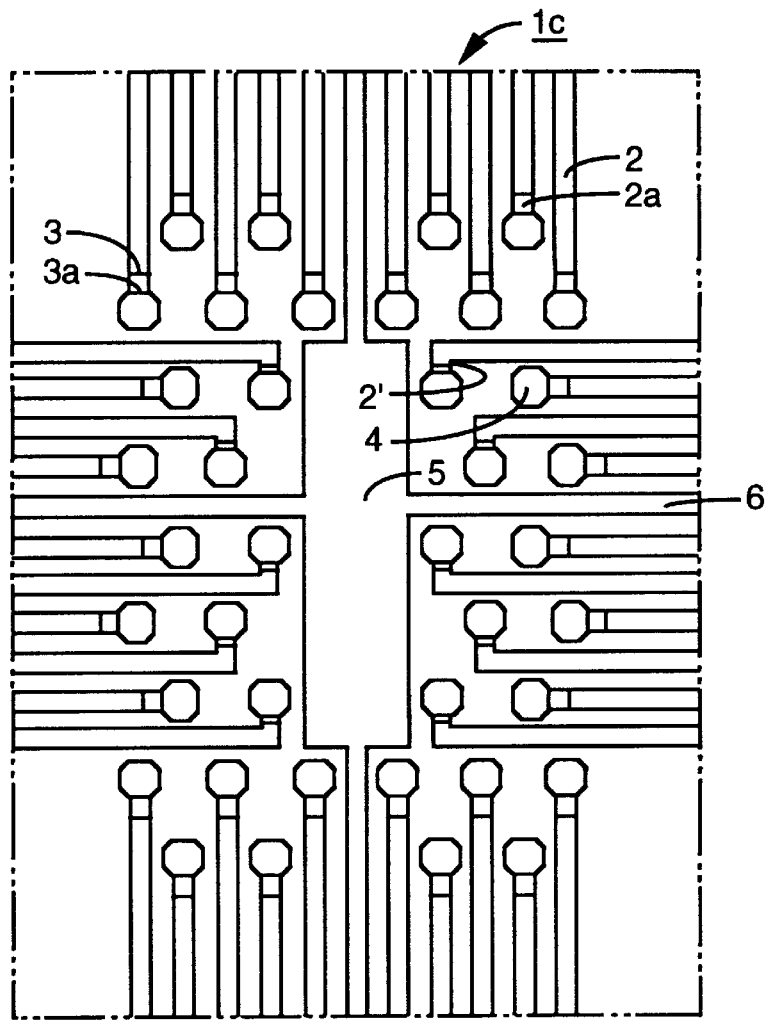
FIGS. 6A and 6B are a schematic partial plan view and a perspective view, respectively, showing a grid array type lead frame according to a fifth preferred embodiment of the present invention.

FIG. 6A shows a grid array type lead frame 1c according to a fifth embodiment of the present invention in a schematic plane view in which a region used for a semiconductor package is defined by the outer line along which cutting is to be performed after the fabrication of the semiconductor package.

Figure 6B:
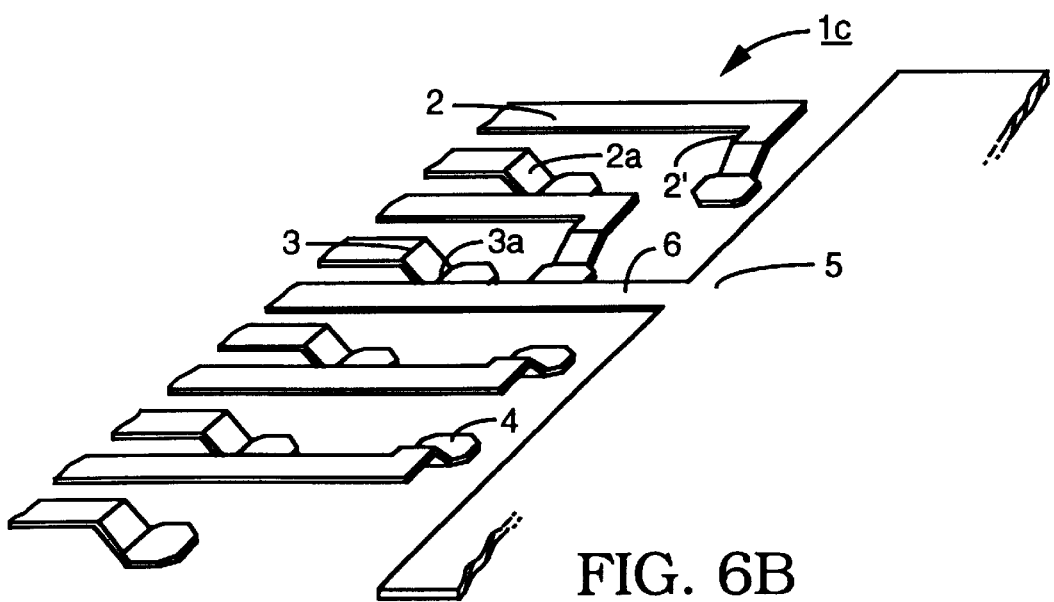

FIG. 6B is a schematic partial perspective view showing the left portion of FIG. 6A. The lead frame 1c of the fifth embodiment has a structure substantially identical to that of the fourth embodiment shown in FIGS. 5A and 5B, except that the different plane direction-converting lead parts 2a are slant bent to YZ or XZ axis downward direction instead of to Z axis downward direction.

In more detail, the frame 1c according to the fifth embodiment of the present invention has a plurality of leads 2 classified into 6 groups by length, which extend from four sides to the direction of a central chip pad 5.

Of the six lead groups two with different lengths are basically directed to Y axis. The leads subject to these two groups are arrayed alternately and slant bent to YZ axis downward direction, instead of being perpendicularly bent to Z axis downward direction as shown in FIG. 5B, by first bending parts 3.

Being alternately arrayed, the remaining four lead groups, each having a predetermined different length, are directed basically to X axis. Of them, two groups comprise the leads that have identical plane Y axis direction converting lead parts 2' In contrast, no identical plane direction-converting lead parts are found in the leads subject to the other two groups. The leads 2 having no identical plane direction-converting lead part 2' are slant bent to XZ axis downward direction, instead of being perpendicularly bent to Z axis downward direction, by first bending parts 3. Similarly, the leads having identical plane Y axis direction converting lead parts 2' are slant bent to YZ axis downward direction, instead of being perpendicularly bent to Y axis downward direction, by the first bending parts 3.

Figure 7A:
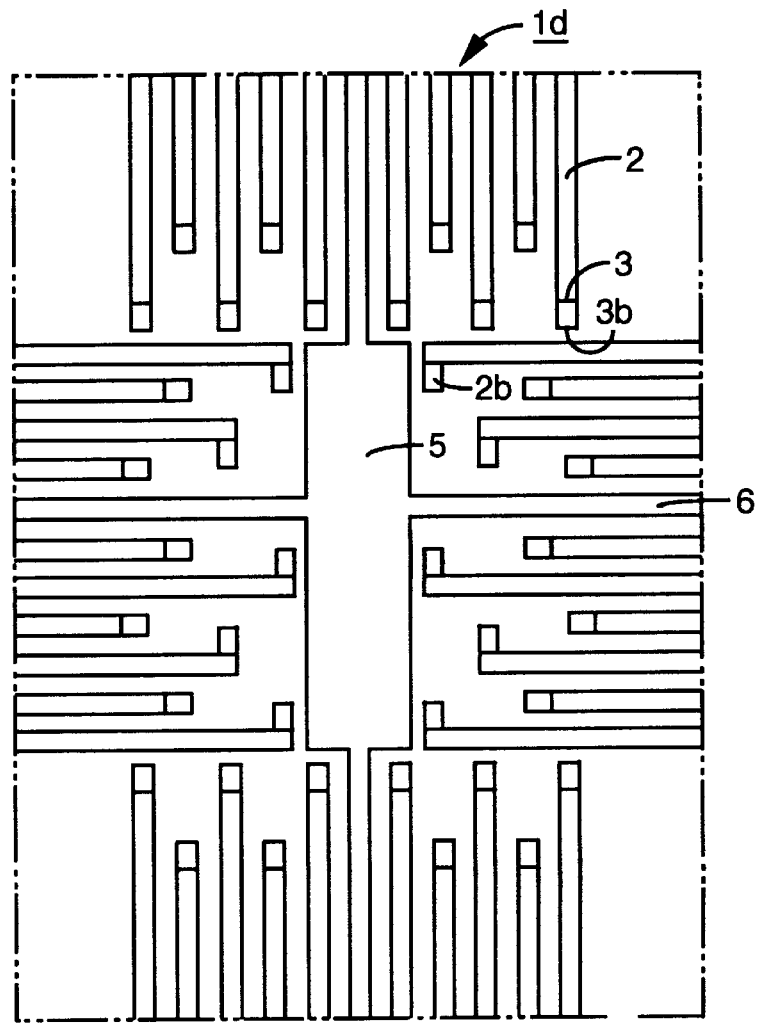
FIGS. 7A and 7B are a schematic partial plan view and a perspective view, respectively, showing a grid array type lead frame according to a sixth preferred embodiment of the present invention.
Figure 7B:
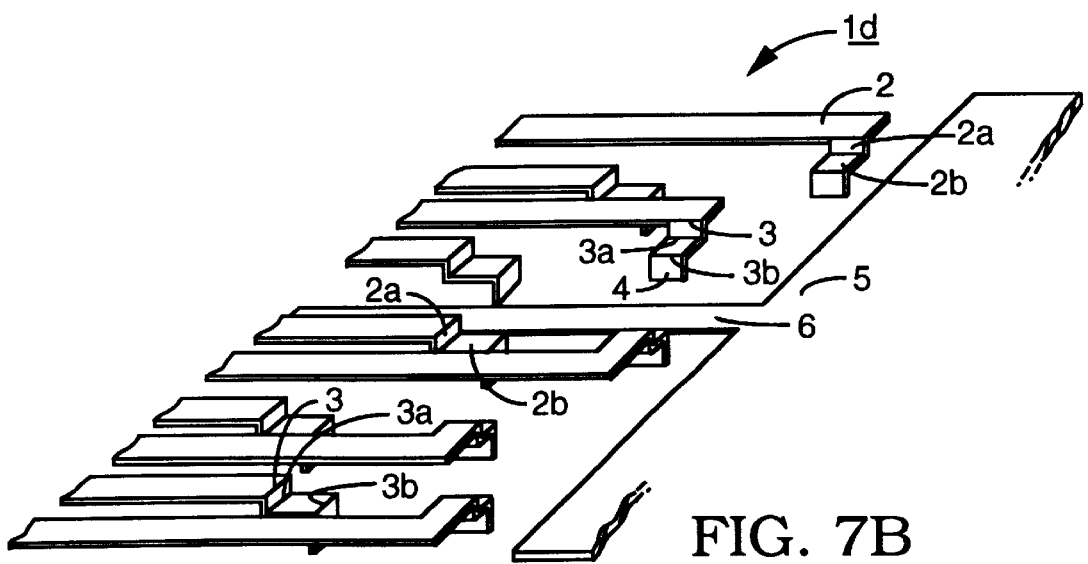

A grid array type lead frame 1d according to a sixth embodiment of the present invention is shown in a schematic plane view of FIG. 7A. FIG. 7B is a schematic partial perspective view showing a left side portion of the plane view of FIG. 7A.

The lead frame 1d in accordance with the sixth embodiment of the present invention is substantially identical to the third and the fourth embodiments, in structure, and thus, the difference between them will be described below.

As shown in FIG. 7A, the frame 1d according to the sixth embodiment of the present invention has a semiconductor chip pad 5 supported to side rails by tie bars 6, and a plurality of leads 2 classified into 6 groups by length, which extend from four sides to the direction of the chip pad 5.

Of the six lead groups two with different lengths are directed to Y axis. The leads 2 subject to these two groups are arranged alternately and their extension is terminated at lead ends 4. During extension, each of the leads directed to Y axis is perpendicularly bent to Z axis downward direction, then to Y axis direction and finally to Z axis downward direction by the first, the second and the third bending parts 3, 3a and 3b, respectively. In detail, the first direction-conversion of the lead by the first bending part 3 results in the formation of a different plane direction-converting lead part 2a (not shown: see FIG. 7B) which is, in turn, perpendicularly bent to Y axis direction by the second bending part 2a (appears to be overlaid with the bending part 3 in FIG. 7A: see FIG. 7B) to form a different plane direction-converting lead part 2b. It is again perpendicularly bent to Z axis downward direction by the third bending part 3b to form a lead end 4 (not shown in FIG. 7A: see 7B). This lead end 4 is formed without expansion so that it is identical to the lead 2 in width. Being alternately arrayed, the remaining four lead groups, each having a predetermined different length, are directed to X axis. Of them, two groups are relatively longer groups, the leads of which have no identical plane direction converting lead parts. These leads extend only to X and Z axis directions. Also no identical plane direction-converting lead parts are found in the leads subject to the other two groups, which are relatively shorter groups. In contrast to the relatively long leads, these relatively short leads extend to all X, Y and Z axis directions. Such leads subject to the groups with different lengths and patterns are alternately arrayed.

As seen in FIG. 7B, the leads 2 extending only to X and Z axis directions are bent in the same step pattern as in the leads directed to the chip pad 5 in Y axis (lengthwise in FIG. 7A) except that different plane direction-converting lead parts formed by second bending parts 3a extend to X axis direction, the extension direction of the leads.

In each of the leads 2 extending to all X, Y and Z axis directions, a different plane direction-converting lead part 2a starts at a side of the end of the lead, perpendicularly extending the lead to Z axis downward direction. The different plane direction-converting lead part 2a is perpendicularly bent to Y axis direction by a second bending part 3a, to form another different plane direction-converting lead part 2b whose direction is perpendicularly converted into Z axis downward direction by a third bending part 3b, to form a lead end 4. Therefore, the leads each form steps in total.

Consequently, the extension of the leads are terminated positions on the same plane below the semiconductor chip-mounting region except for the chip pad 5, so that a grid array consisting of fourteen alternating lines and fourteen alternating rows (the fourth and the seventh rows are symmetric reciprocally) is constructed in view of the lead ends.

Figure 8A:
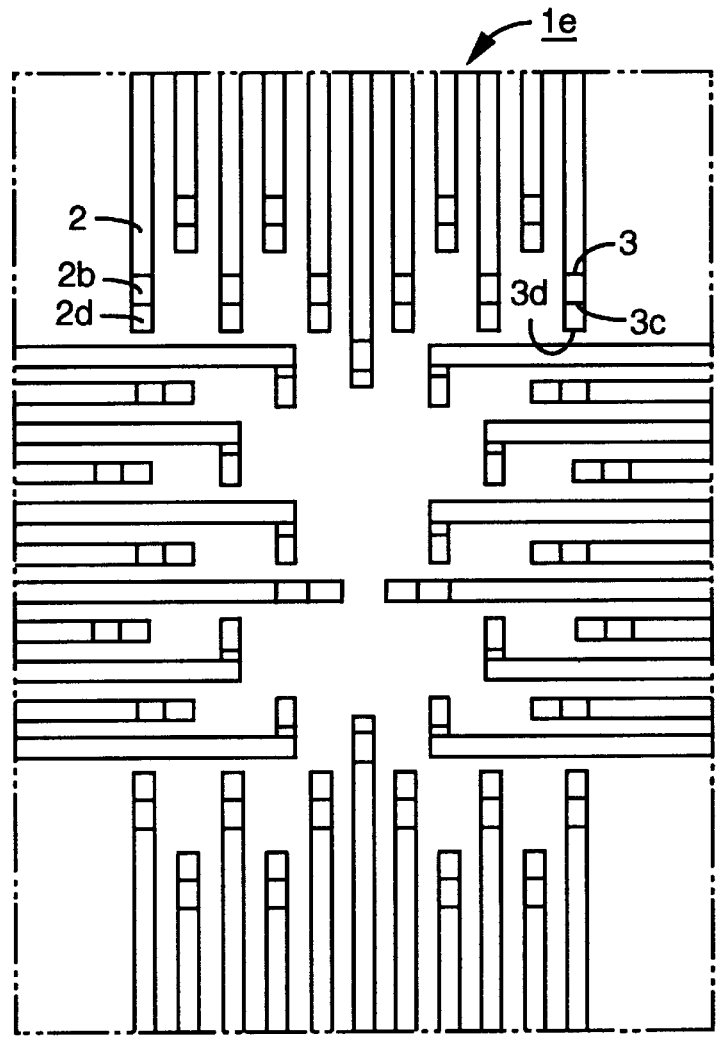
FIGS. 8A and 8B are a schematic partial plan view and a perspective view, respectively, showing a grid array type lead frame according to a seventh preferred embodiment of the present invention.
Figure 8B:
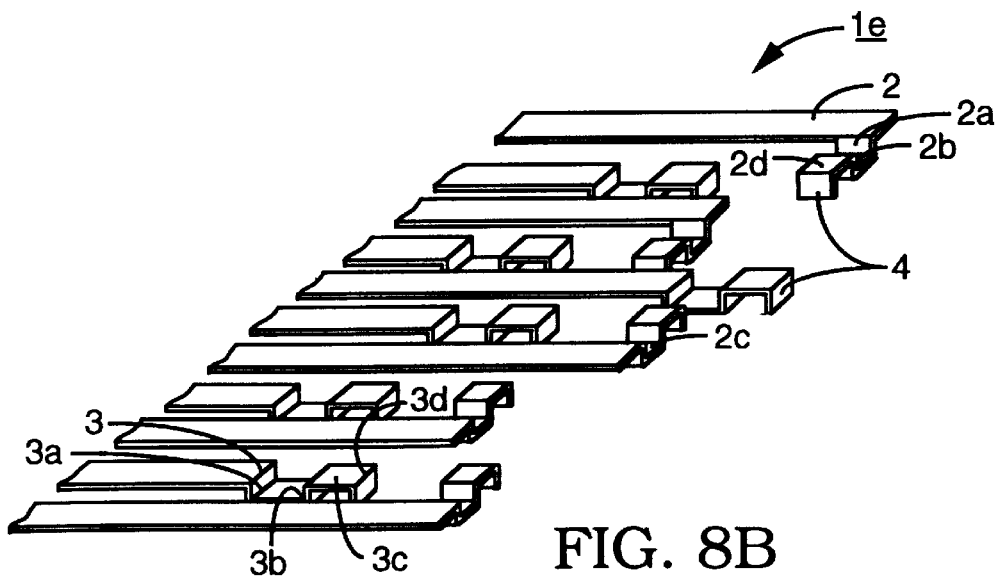

A grid array type lead frame 1e according to a seventh embodiment of the present invention is shown in a schematic plane view of FIG. 8A. FIG. 8B is a schematic partial perspective view showing a left side portion of the plane view of FIG. 8A.

The lead frame 1e in accordance with the seventh embodiment of the present invention is substantially identical to the sixth embodiment, in structure, except for the bending pattern of the lead 2 and the absence of a chip pad.

As shown in FIG. 7A, the frame 1d according to the seventh embodiment of the present invention has a plurality of leads 2 classified into eight groups by length, which extend from four-sides to the central portion of the frame 1d.

Of the eight lead groups three with different lengths directed to Y axis (lengthwise in FIG. 8A). The leads 2 subject to these three groups are arranged alternately (the longest leads are positioned at center) and their extension is continued to lead ends 4. During extension, each of the leads directed to Y axis is first perpendicularly bent to Z axis downward direction by a first bending part 3 to form a different plane direction-converting lead 2a (not shown in FIG. 8A; see FIG. 8B), which is, then, perpendicularly bent to Y axis direction by a second bending part 3a (appears to be overlaid with the bending part 3; see FIG. 8B), creating another different plane direction-converting lead part 2b. It is again perpendicularly to Z axis direction, but upward, by a third bending part 3b (appears to be overlaid with a bending part 3c; see FIG. 8B), to give a further different plane direction-converting lead part 2c (not shown in FIG. 8A; see FIG. 8B). The extending direction of the different plane direction-converting lead part 2c is perpendicularly converted into Y axis by a fourth bending part 3c to give another different plane direction-converting lead part 2d which is, in turn, perpendicularly bent to Z axis downward direction to form a lead end 4. Thus, each of the leads forms a fallen S shape in total. The lead end 4 is formed without expansion so that it is identical to the lead 2 in width.

Being alternately arrayed, the remaining five lead groups, each having a predetermined different length, are directed to X axis (lengthwise in FIG. 8A). Of them, two groups are relatively short and one group is the longest. The leads 2 subject to these three groups extend only to X and Z axis directions. The leads 2 subject to the other groups extend to all X, Y and Z axis directions. Such leads subject to the groups with different lengths and patterns are alternately arrayed.

As seen in FIG. 8B, the leads 2 extending only to X and Z axis directions are bent in the same step pattern as in the leads directed to the central part in Y axis (lengthwise in FIG. 8A) except that the different plane direction-converting lead parts 2b and 2d formed by the second and the fourth bending parts 3a and 3c extend to X axis direction, the extension direction of the leads.

In each of the leads 2 extending to all X, Y and Z axis directions, no identical plane direction-converting lead parts are found. However, a different plane direction-converting lead part 2a starting at a side of the end of the lead 2, perpendicularly extending the lead to Z axis downward direction by a first bending part 3. The different plane direction-converting lead part 2a is perpendicularly bent to Y axis direction by a second bending part 3a, to form another different plane direction-converting lead part 2b. It is, in turn, perpendicularly bent to Z axis upward direction by a third bending part 3b to give another different plane direction-converting lead part 2c whose direction is perpendicularly converted into Y axis by a fourth bending part 3c to form another different plane direction-converting lead part 2d. Finally, it is perpendicularly bent to Z axis downward direction by a fifth bending part 3d to give a lead end 4. Thus, each of the leads forms a fallen S shape in total. The lead end 4 is formed without expansion so that it is identical to the lead 2 in width.

In each of the leads 2, the direction-converting lead part 2b positioned between the different plane direction converting lead part 2a and the different plane direction converting lead part 2c which result from the bending to Z axis downward direction at the first bending part 3 and the bending to Z axis upward direction at the third bending part 3b, respectively, and the lead end 4 are located at predetermined positions on the same plane below the semiconductor chip-mounting region. If a semiconductor package is fabricated using this lead frame, there are significant advantages in that two or more input and output terminals can be formed in one lead 2 and the different plane direction-converting lead part 2b functions as a heat-sink pin.

Consequently, the extension of the leads is terminated at the lead ends 4 of which each are located at predetermined positions on the same plane below the semiconductor chip-mounting region, so that a grid array consisting of 28 alternating lines and 23 alternating rows is constructed in view of the lead ends.

The above-illustrated various grid array type lead frames each can be easily obtained by cutting a strip material consisting of a plurality of unit frames with a cutter to give a planar frame prototype with a desired shape, positioning the frame prototype on a press die having a desired lead contour and pressing the prototype with a press matched with the desired lead contour.

Hereinbefore, the preferred embodiments for the grid array type lead frames of the present invention have been described but are not intended to limit the present invention. Thus, so far as the leads classified into many groups by length have the different plane direction-converting lead parts and/or the identical plane direction-converting lead parts by means of the bending parts and their extension is terminated at the lead ends which are located on a package bottom corresponding to the semiconductor chip-mounting region, forming a grid array, the resultant frames are within the scope of the present invention. It should be understood that the present invention is not limited by changing or modifying the number, array type or length of the lead, the number of the lead group, the number, shape or bending angle of the different plane direction-converting lead parts, or the pattern of the grid array, or by the presence or absence, shape, or bending angle of the identical plane direction-converting lead parts, or the presence or absence of the semiconductor chip-mounting pad.

Figure 9A:
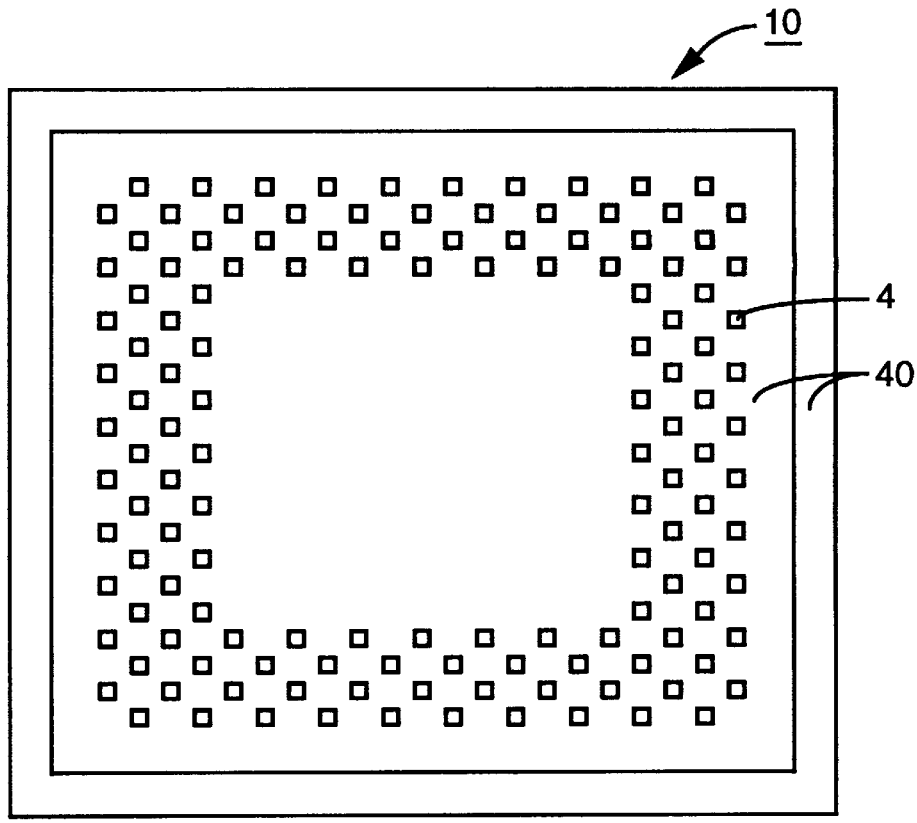
FIGS. 9A and 9B each show the arrays of the exposed lead ends in lead end grid array semiconductor packages employing the grid array type lead frames of the present invention.
Figure 9B:
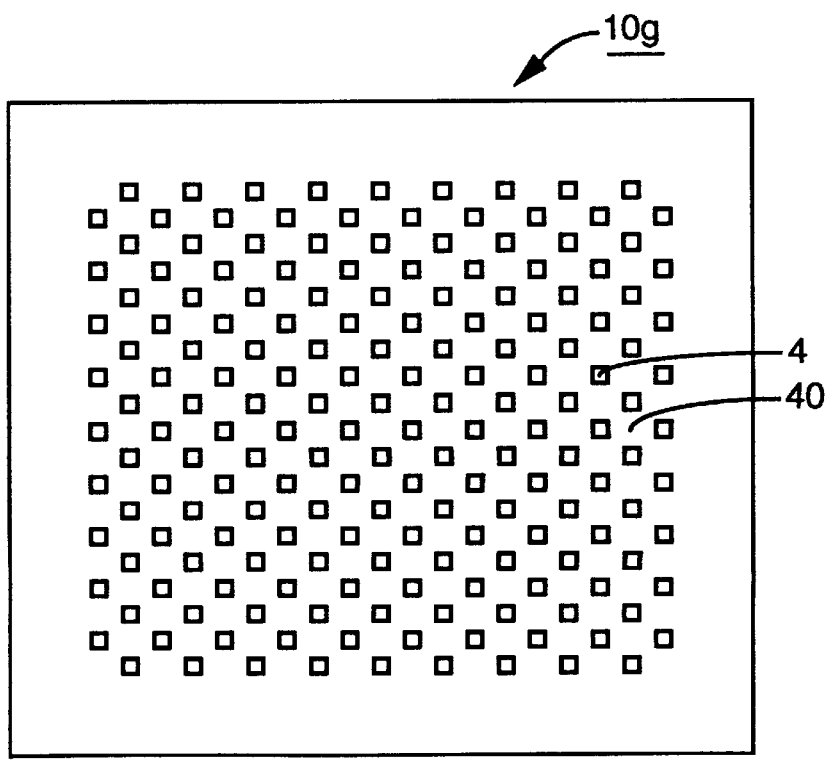

FIGS. 9A and 9B each are schematic bottom views of the lead end grid array semiconductor packages which are fabricated by mounting chips on the grid array type lead frames of the present invention, electrically connecting the semiconductor chips with the lead frames and molding to form plastic encapsulating parts, showing the arrays of the lead ends 4 exposed out of the bottom of the package.

FIG. 9A shows the bottom of a lead end grid array semiconductor package employing a grid array type lead frame of the present invention in which a semiconductor chip pad is positioned at the center. As seen, a plurality of lead ends 4 exposed out of the bottom of a plastic encapsulating part 40 are positioned in a grid array pattern within the region corresponding to a semiconductor chip (not shown) mounting region but not within the region corresponding to a semiconductor chip pad (its area is far smaller than the chip's area). However, the package may be fabricated in such a manner that the lead ends 4 are positioned within the package bottom region corresponding to the semiconductor chip pad. The position of the lead ends is optional. Preferred is to array a row and a line of the lead ends alternately with the neighboring rows and lines of the lead ends because such alternately can increase the number of the lead ends, used as input and output terminals, per area as well as widen the distance between the neighboring exposed lead ends.

FIG. 9B shows the bottom of a lead end grid array semiconductor package employing a grid array type lead frame of the present invention in which a semiconductor chip pad is not formed at the center. As shown in FIG. 9B, the lead ends 4 are distributed uniformly throughout the bottom of a plastic encapsulating part 40 which has an area as large as that of a semiconductor chip, resulting in the formation of an alternating grid array. However, the presence and absence of a semiconductor chip pad and the grid array pattern of the lead ends exposed out of the bottom of the plastic encapsulating part are optional and can be variously modified or changed if necessary.

Below, a detailed description will be given of a variety of lead end grid array semiconductor packages employing the grid array type lead frames according to the present invention, in conjunction with the accompanying drawings.

Figure 10A:
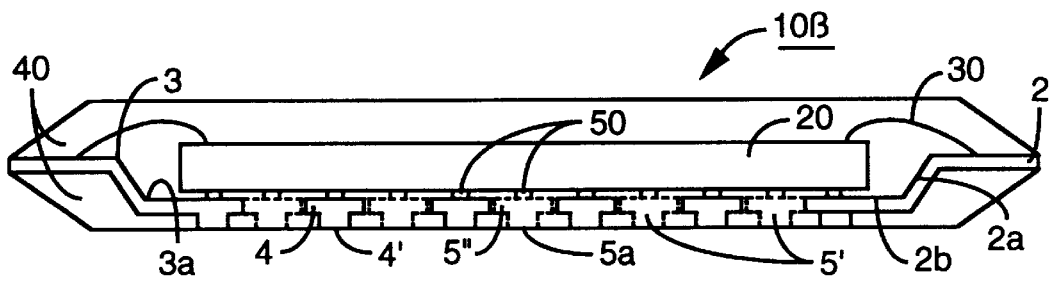
FIGS. 10A and 10B are schematic cross sectional views showing lead end grid array semiconductor packages employing the grid array type lead frames of FIGS. 1A and 1B, respectively, in accordance with a first preferred embodiment of the present invention.
Figure 10B:
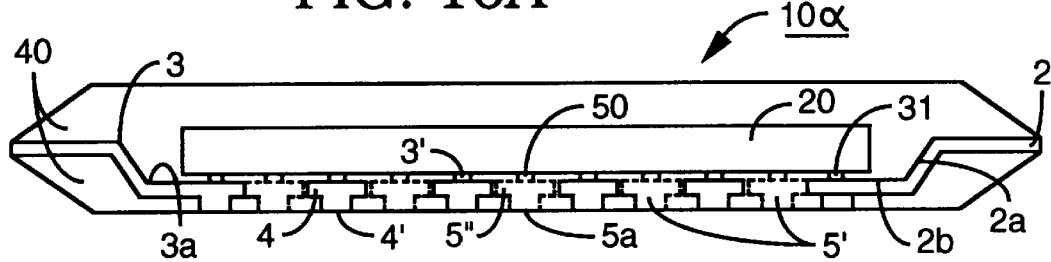

Referring to FIGS. 10A and 10B, there are, in schematic cross sectional views, shown lead end grid array semiconductor packages 10a and 10B according to a first preferred embodiment of the present invention, that employ the grid array type lead frames 1 of FIGS. 1A and 1B, respectively.

The lead end grid array semiconductor package of FIG. 10A comprises a plurality of leads 2 classified into many groups by length, each extending to a lead end 4, a semiconductor chip 20 mounted on semiconductor chip pads 5' and 5" by an adhesive means, such as an adhesive tape or an epoxy resin, a bond wires 30 for electrically connecting the leads 2 with bond pad (not shown) located at a predetermined position on the semiconductor chip 20, and a plastic encapsulating part 40 for protecting the semiconductor chip 20, the bond wires 30 and the leads 2 from external environment, said lead ends 4 being protruded from the bottom of said encapsulating part 40 to give prominences 4' whose distribution is a pattern of the alternating grid array. The prominences are used as input and output terminals.

In more detail, the leads 2 which can be classified into groups by length and the semiconductor chip pad 5', 5" utilize the grid array type lead frame 1 according to the first preferred embodiment (cut along the dotted lines in FIG. 1A). The leads 2 are classified into 8 groups by length. Each of the leads 2 has a different plane direction-converting lead part 2a slant bent by a first bending part 3 near the four sides of the semiconductor package 10a and a different plane direction-converting lead part 2b bent by a second bending part 3a. The different plane direction-converting lead part 2b is positioned on a plane parallel to the bottom of the semiconductor package 10a. While, in some of the leads 2, 2, 4 or 6 identical plane direction-converting lead parts are formed, in the other leads, there is no identical plane direction-converting lead (not shown in FIG. 10A; see FIG. 25 1A). They are alternately arrayed (see FIG. 1A).

The extension of the different plane direction-converting lead parts 2b is terminated at the lead end 4 which is expanded in a square form. At the bottom of the lead end 4, a cylindrical lead end prominence 4' is formed, functioning as an input and output terminal. The presence or number of the identical plane direction-converting lead parts (that is, direction conversion on plane) in the leads, the downwardly bending angle of the different plane direction-converting lead parts, and the number of the leads are optional and may be appropriately selected according to necessity. A lead end tip 4" is formed beside at least one side of the lead end 4 including the side to the direction of which the lead extends (see FIG. 1A). The lead end tip 4" may be also formed beside the other side of the lead end 4 but not beside the side to which the lead 2 is integrated. The lead end tip 4" plays a role of firmly fixing the lead end 4 within a plastic encapsulating part (not shown) which is formed by molding upon fabrication of semiconductor package. Traversing the center of the lead frame, the linear semiconductor chip pads, represented by dotted lines, consists of two rectangular chip pads 5' which are positioned at the left and the right sides of the grid array type lead frame and three square chip pads 5" which are located in the middle area (see FIG. 1A). The pads 5' and 5" are interconnected with each other and supported in a line by a member 6'. To one end of the rectangular chip pad 5', two separate tie bars 6 (cut along the dotted lines of FIG. 1A) are attached which are bent by the first and the second bending parts 3 and 3a in the same patterns as in the case of the leads 2. Hence, the chip pads are located on the same plane with the different direction-converting lead parts 2b and the lead end 4. Below the chip pads 5' and 5", cylindrical prominences 5a are formed by etching, as in the case of the lead ends 4. Since the cylindrical prominences 5a are exposed to the exterior of the plastic encapsulating part 40, they serve as heat sinks through which the heat generated during operation of the semiconductor chip 20 can be efficiently emitted. It is a matter of course that such shape and array of the chip pads 5' and 5" may be modified if necessary.

On the pad 5' and 5", the semiconductor chip 20 is attached by an adhesive means such as epoxy resin or adhesive tape. However, in this embodiment, the chip 20 can be attached on all or a selected number of the lead ends 4 by the adhesive means 50.

Being at the same distance away from the four sides of the lead end grid array semiconductor package 10a according to the first embodiment of the present invention, the first bending parts 3 bend all of the leads 2 at the same angle. Likely, being at the same distance away from the four sides, the second bending parts 3a bend all of the leads such at the same angle that the different plane direction-converting lead parts 2b are located on the same plane parallel to the bottom of the semiconductor package 10a. Thus, one identical bending pattern is made for the leads subject to all eight groups and another identical bending pattern for all tie bars while the length of the different plane direction-converting lead parts 2b and the direction conversion on XY plane are varied according to the lead groups. Therefore, the lead end prominences 4' of all of the leads 2 are alternately arrayed in 8 lines and 11 rows on the bottom of the plastic encapsulating part 40 corresponding to the semiconductor chip-mounting region, resulting in the formation of a grid array (see FIG. 1A). This grid array allows the semiconductor chips to be scaled in the semiconductor package.

In this embodiment, the lead end prominences 4' are located on the same plane with the bottom of the plastic encapsulating part 40 but the present invention is not limited to it. Therefore, they are protruded from the bottom or fused thereinto by solder balls.

The semiconductor package 10B of FIG. 10B is a modification of the semiconductor package 10a of FIG. 10A. Instead of using the wires 30 as the connecting means by which the bond pad (not shown) on the semiconductor chip 20 is electrically connected with the leads 2 in FIG. 10A, bumps or solder joints 31 are used to electrically connect a bond pad formed below the semiconductor chip with the leads 2 in FIG. 10B. If necessary, the connection of the bond pad formed below the semiconductor chip 10 with the leads can be accomplished by wires.

Besides, the plastic encapsulating part may be formed in such a manner that the upper surface of the semiconductor chip is exposed to the exterior, with the aim of efficiently emitting the heat generated during the operation of the semiconductor chip. Such formation can yield a light, thin, short and small semiconductor package. Alternatively, a heat sink may be attached on the semiconductor package 2 or more sheets of semiconductor chips may be laminated.

Figure 11A:
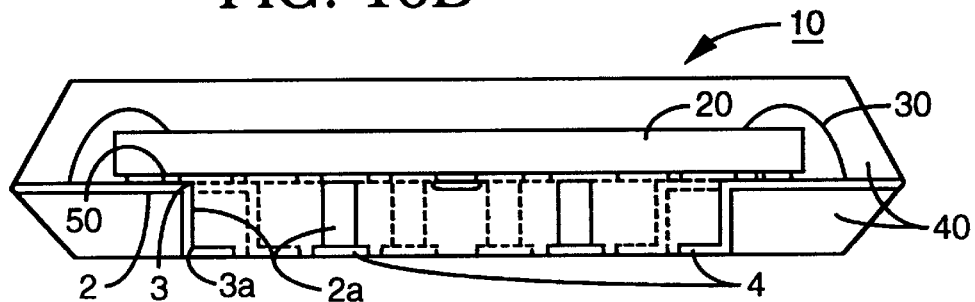
FIGS. 11A, 11B and 11C each are schematic cross sectional views showing lead end grid array semiconductor packages employing the grid array type lead frame of FIGS. 5A and 5B, in accordance with a second preferred embodiment of the present invention.
Figure 11B:
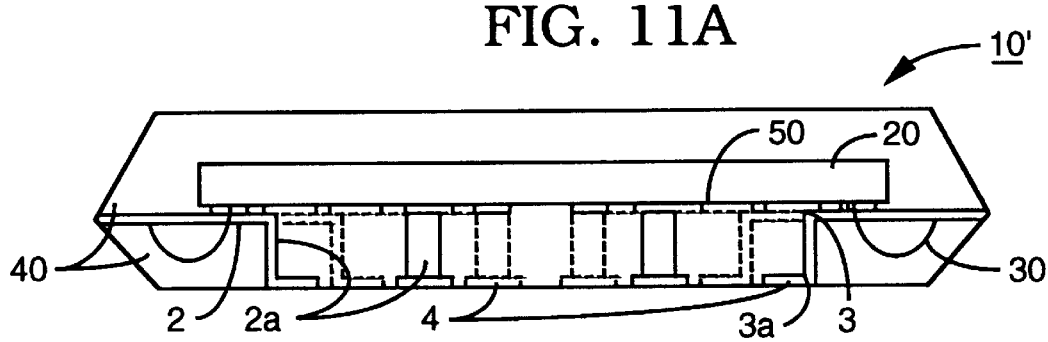
Figure 11C:
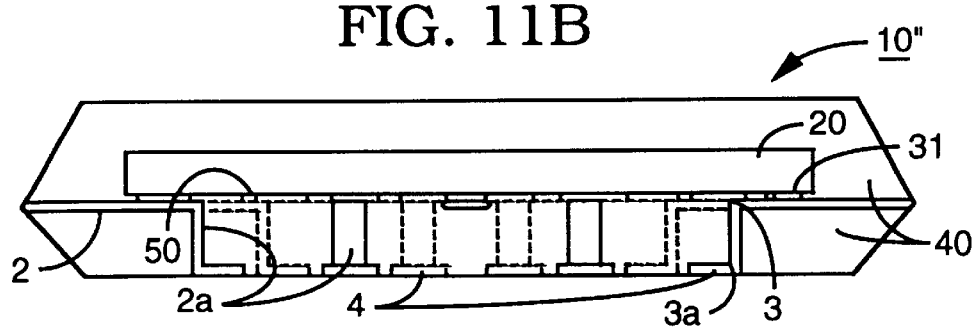

FIGS. 11A, 11B and 11C are schematic cross sectional views respectively showing lead end grid array semiconductor packages 10, 10' and 10'' according to a second preferred embodiment of the present invention, all employing the grid array type lead frame 1b of FIGS. 5A and 5B. A description will be given of the semiconductor package of FIG. 11A for the first time.

The lead end grid array semiconductor package of FIG. 11A comprises a plurality of leads 2 classified into many groups by length, each extending to a lead end 4, a semiconductor chip 20 mounted on a semiconductor chip pad 5 by an adhesive means, such as an adhesive tape or an epoxy resin, bond wires for electrically connecting a bond pad (not shown) located at a predetermined position on the semiconductor chip 20 with non-bent parts of the leads 2 from above, and a plastic encapsulating part 40 for protecting the semiconductor chip 20, the bond wires 30 and the leads 2 from external environment, said encapsulating part 40 being formed by molding in such a manner that said lead ends are exposed to the exterior, forming an alternating grid array.

Here, the leads 2 with identical plane direction-converting lead parts (their front faces directed to front in 10 FIG. 11A) and the leads 2 without identical plane direction-converting lead parts (their side faces directed to front in FIG. 11A) are alternately arrayed (see FIGS. 5A and 5B). In the lead end grid array semiconductor package 10 of the present invention, a semiconductor chip pad 5 supported by tie bars 6 may be formed as shown in FIG. 5A, but it is optional. The leads 2 represented by dotted lines stand for ones near the cut side in the rear.

In more detail, the leads 2 which can be classified into groups by length and the semiconductor chip pad 5 utilize the grid array type lead frame 1b according to the fourth preferred embodiment. The leads 2 are classified into 6 groups by length. Each of them is perpendicularly bent in a downward direction by a first bending part 3 to create a different plane direction-converting lead part 2a which is, then, perpendicularly bent to Y axis direction by a second bending part 3a. The extension of the lead is terminated at an expanded lead end 4 which is located on the same plane with the bottom of the semiconductor package 10. The identical plane direction-converting lead parts (not shown) are formed in a selected number of the leads.

In the lead end grid array semiconductor package 10 according to the second preferred embodiment of the present invention, the positions of the first and the second bending parts 3 and 3a in the leads 2 are different from one lead group to another. The specific bending and array pattern of the leads may be referred to FIGS. 5A and 5B.

The leads ends numbering as many as the leads, used as input and output terminals, are presently bared on the bottom of the semiconductor package, that is, the bottom of the plastic encapsulating part 40, forming a grid array which alternates in part or total. This grid array allows the semiconductor chips to be scaled in the semiconductor package. In FIG. 11A, the plastic package 10 is depicted to have a much larger dimension than the semiconductor chip has. But, this is for the sake of the drawing. Thus, it should be noted that the dimension difference between the package and the semiconductor chip is significantly very small, relative with the dimension the difference between package and the semiconductor chip in a conventional quad flat semiconductor package or ball grid array type semiconductor package.

The lead end grid array semiconductor packages 10' and 10'' of FIGS. 11B and 11C are substantially the same as the semiconductor package 10 of FIG. 11A in basic structure. However, in the lead end grid array semiconductor package 10', no semiconductor chip pad exists, bond pads (not shown) are located on the bottom of semiconductor chip 20 and bond wires connect the bond pads to the lower surfaces of the non-bent parts of the leads, from below. The difference of the semiconductor package 10'' of FIG. 11C from the semiconductor package 10 of FIG. 11A is that bond pads (not shown) are located on the lower surface of semiconductor chip and electrically connected with leads 2 by bump or solder joints. In the lead end grid array semiconductor packages 10, 10' and 10'' according to the second preferred embodiment of the present invention, the lead ends used as input and output terminals are formed into planar expanded parts, which contribute to the ease of connection with a mother board (not shown) and to the efficiency of the emission of the heat generated during semiconductor chip operation.

Figure 12:
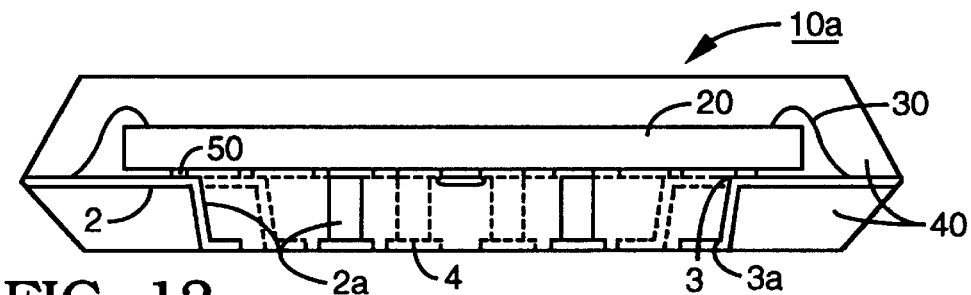
FIG. 12 is a schematic cross sectional view showing a lead end grid array semiconductor package employing the grid array type lead frames of FIGS. 1A and 1B, in accordance with a third preferred embodiment of the present invention.

FIG. 12 is a schematic cross sectional view showing a lead end grid array semiconductor package 10a employing the grid array type lead frame of FIGS. 6A and 6B, in accordance with a third preferred embodiment of the present invention. The lead end grid array semiconductor package 10a is substantially the same with the second embodiment of FIG. 11A, except that, whereas the different plane direction-converting lead part 2a is perpendicularly bent to Z axis downward direction by the first bending part 3 in FIG. 11A, the different plane direction-converting lead part 2a is slant bent to Z axis downward direction. The same modifications in the electrical connection between the semiconductor chip 20 and the leads 2 as in the cases of FIGS. lib and 11C, for example, the change in connection position and the connecting means such as bump, can also be applied for the lead end grid array semiconductor package according to the third preferred embodiment of the present invention.

Figure 13:
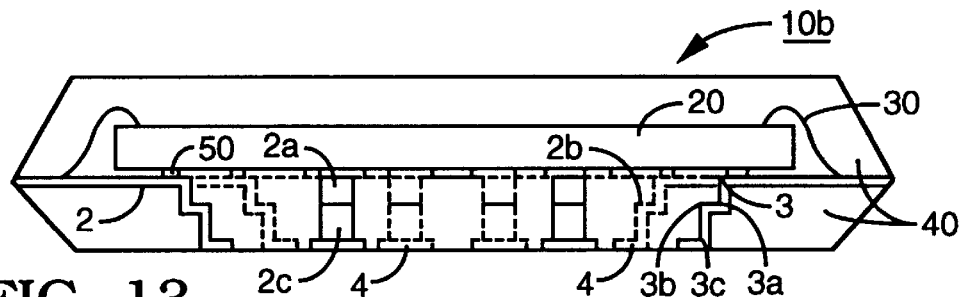
FIG. 13 is a schematic cross sectional view showing a lead end grid array semiconductor package employing the grid array type lead frame of FIG. 5A and 5B, in accordance with a fourth preferred embodiment of the present invention.

FIG. 13 is a schematic cross sectional view showing a lead end grid array semiconductor package 10b employing a modified grid array type lead frame of FIGS. 5A and 5B, in accordance with a fourth preferred embodiment of the present invention. Its basic structure is substantially the same as in the cases of FIGS. 11A and 12. Thus, a description will be given of the difference therebetween, below.

In the semiconductor package 10b of FIG. 13, the leads (their front faces directed to front) with identical plane direction-converting lead parts (not shown; see FIGS. 5A and 5B) and the leads 2 (their side faces directed to front)

without identical plane direction-converting lead parts are alternately arrayed.

Each of the leads 2 having no identical plane direction-converting lead parts comprises a different plane direction-converting lead part 2a perpendicularly bent to Z axis downward direction by a first bending part 3, another different plane direction-converting lead part 2b perpendicularly bent to X axis direction by a second bending part 3a, a further different plane direction-converting lead part 2c perpendicularly bent to Z axis downward by a third bending part 3b, and a lead end 4 perpendicularly bent to X axis direction by a fourth bending part 3c. The lead end 4 is expanded into a square form wider than the lead. Thus, the lead 2 is bent in a step pattern in total.

Similarly, each of the leads 2 having identical plane direction-converting lead parts by which the leads are perpendicularly bent to Y axis (see FIGS. 5A and 5B), comprises a different plane direction-converting lead part 2a perpendicularly bent to Z axis downward direction by a first bending part 3, another different plane direction-converting lead part 2b perpendicularly bent to Y axis direction by a second bending part 3a, a further different plane direction-converting lead part 2c perpendicularly bent to Z axis downward by a third bending part 3b, and a lead end perpendicularly bent to Y axis direction by a fourth bending part 3c. The lead end 4 is expanded into a square form wider than the lead. Thus, the lead 2 is bent in a step pattern in total.

Figure 14:
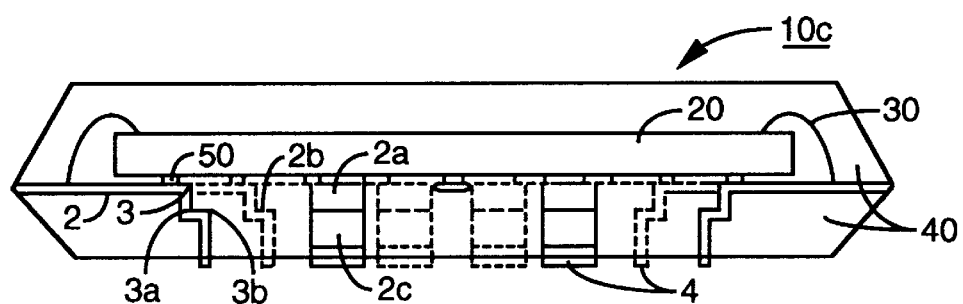
FIG. 14 is a schematic cross sectional view showing a lead end grid array semiconductor package employing the grid array type lead frame of FIGS. 7A and 7B, respectively, in accordance with a fifth preferred embodiment of the present invention.

FIG. 14 is a schematic cross sectional view showing a lead end grid array semiconductor package 10c employing a modified grid array type lead frame of FIGS. 7A and 7B, in accordance with a fifth preferred embodiment of the present invention. Its basic structure is substantially the same as in the cases of FIG. 13. Thus, a description will be given of the difference there between, below.

In the semiconductor package 10c of FIG. 14, the leads 2 (their front faces directed to front) with identical plane direction-converting lead parts (not shown; see FIGS. 7A and 7B) and the leads 2 (their side faces directed to front) without identical plane direction-converting lead parts are alternately arrayed.

Compared with the case of FIG. 13, the fourth bending part 3c is not present in the lead 2 having no identical plane direction-converting lead part, so that the lead end 4 is formed by the third bending part 3b. Another difference between the semiconductor package 10c of FIG. 14 and the semiconductor package 10b of FIG. 13 is that the lead 2 is not expanded into a square form but has its original width.

A further difference is that the lead 2 having the identical plane direction-converting lead part is bent once more. That is, each of the leads which have identical plane direction-converting lead parts (not shown in FIG. 13; see FIGS. 7A and 7B) perpendicularly bent to Y axis direction, has a different plane direction-converting lead part 2a perpendicularly bent to Z axis downward direction by a first bending part 3, another different plane direction-converting lead part 2b perpendicularly bent to Y axis direction by a second bending part 3a, a further different plane direction-converting lead part 2c perpendicularly bent to Z axis downward by a third bending part 3b, another different plane direction-converting lead part 2d perpendicularly bent to Y axis by a fourth bending part 3c (not shown), and a lead end perpendicularly bent to Z axis downward direction by a fifth bending part 3d. The lead end 4 is as wide as the lead 2.

Thus, the number of the direction conversion is different from the leads having identical plane direction-converting lead parts to the leads having no identical plane direction-converting lead parts.

As seen in FIG. 14, in the lead end grid array semiconductor package 10c according to the fifth preferred embodiment of the present invention, the lead ends, which form a grid array alternately arranged in part or in total, are protruded out of the bottom of the plastic encapsulating part 40.

Figure 15:
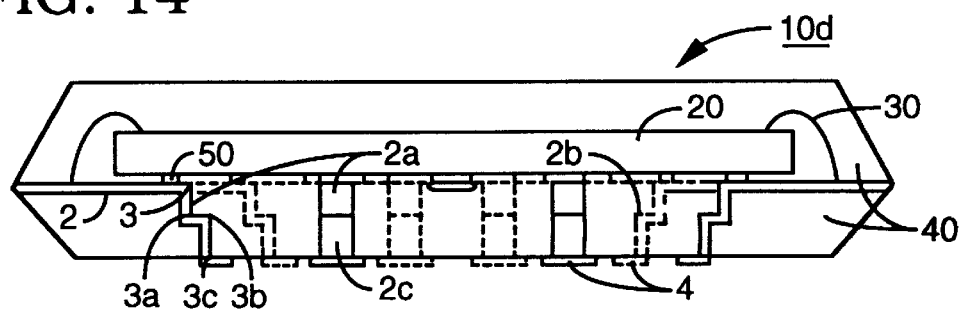
FIG. 15 is a schematic cross sectional view showing a lead end grid array semiconductor package in accordance with a sixth preferred embodiment of the present invention, modified by protruding the lead ends from the bottom of the package of FIG. 13.

FIG. 15 is a schematic cross sectional view showing a lead end grid array semiconductor package 10d according to a seventh preferred embodiment of the present invention. Its basic structure is substantially the same as the semiconductor package 10b of FIG. 13. The only difference there between is that the lead ends are protruded to the extent as large as the thickness of the lead, from the bottom of the package 10d, forming a grid array.

Figure 16:
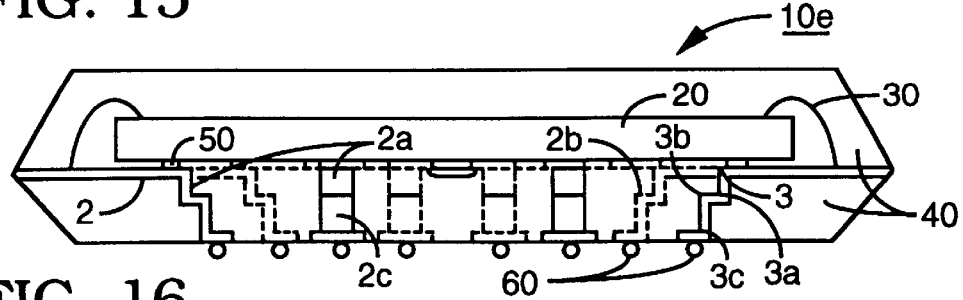
FIG. 16 is a schematic cross sectional view showing a lead end grid array semiconductor package in accordance with a seventh preferred embodiment of the present invention, modified by fusing solder balls into the exposed lead ends of the package of FIG. 13.

FIG. 16 is a schematic cross sectional view showing a lead end grid array semiconductor package 10e according to a seventh preferred embodiment of the present invention. Its basic structure is substantially the same as the semiconductor package 10b of FIG. 13. The only difference therebetween is that the surfaces of the lead ends protruded from the bottom of the package 10e are fused with solder balls so that they are used as input and output terminals, forming a grid array.

Figure 17:
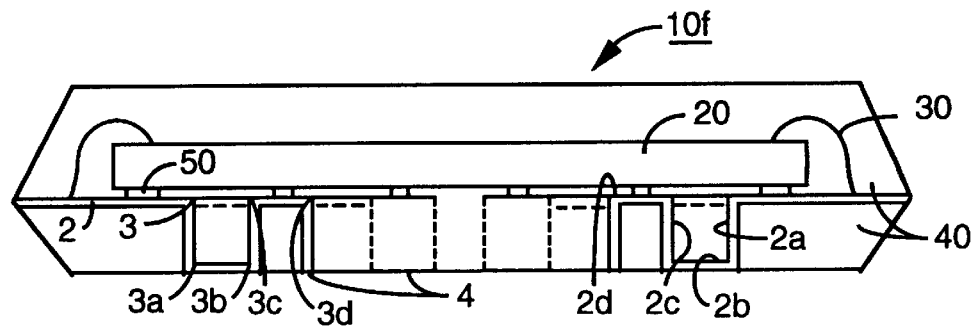
FIG. 17 is a schematic cross sectional view showing a lead end grid array semiconductor package employing the grid array type lead frame of FIGS. 8A and 8B, in accordance with an eighth preferred embodiment of the present invention.

FIG. 17 is a schematic cross sectional view showing a lead end grid array semiconductor package 10f employing a modified grid array type lead frame if of FIGS. 8A and 8B, in accordance with a eighth preferred embodiment of the present invention. Its basic structure is substantially the same as in the cases of FIG. 13, except for the bending pattern of the lead 2.

Each of the leads 2 (defined by a solid line at the left and the right sides on figure) bent only to X and Z axis directions, has a different plane direction-converting lead part 2a perpendicularly bent to Z axis downward direction by a first bending part 3, another different plane direction-converting lead part 2b perpendicularly bent to X axis direction by a second bending part 3a, a further different plane direction-converting lead part 2c perpendicularly bent to Z axis upward by a third bending part 3b, another different plane direction-converting lead part 2d perpendicularly bent to X axis by a fourth bending part 3c (not shown), and a lead end 4 perpendicularly bent to Z axis downward direction by a fifth bending part 3d. Thus, the overall shape of the lead is like a fallen S character.

The leads 2 (partially represented by dotted lines in FIG. 17) which are bent to all X, Y and Z axis directions are identical to the leads which are bent only to X and Z axis directions, except that the different plane direction-converting lead parts 2a are perpendicularly bent to Z axis downward direction by the first bending part 3 (see FIG. 8B) formed perpendicularly to an initial stretch of the lead 2 and the different plane direction-converting lead parts 2b and 2d are directed to Y axis (see 8A and 8B).

In the semiconductor package 10f according to the eighth embodiment of the present invention, the different plane direction-converting lead parts 2b as well as the lead ends 4 are exposed out of the bottom of the plastic encapsulating part 40, forming a grid array. Therefore, it is possible that the leads for signal transmission, power or grounding are set to be multi-pins, such as two or more pins. Alternately, of the different plane direction-converting lead parts 2b and the lead ends 4, both exposed from the bottom of the plastic encapsulating part 40, one can be used for signal transmission, while the other for heat emission.

The above-illustrated two types of the leads which are different in length from each other alternate such that they form a grid array. A more detail can be referred to the above description for FIGS. 8A and 8B.

The same modifications in the electrical connection between the semiconductor chip 20 and the leads 2 as in the cases of FIGS. 11b and 11C, for example, the change in connection position and the connecting means such as bump, can be also applied for the lead end grid array semiconductor packages suggested in FIGS. 10*b*–10*f*.

Figure 18:
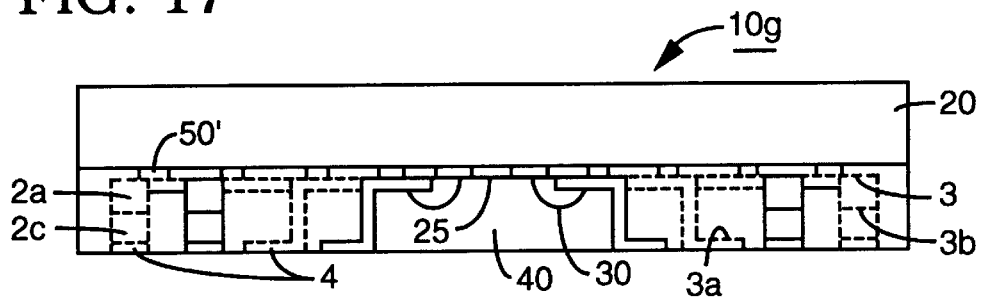
FIG. 18 is a schematic cross sectional view showing a lead end grid array semiconductor package employing a modification of the grid array type lead frame of FIGS. 5A and 5B, in accordance with a ninth preferred embodiment of the present invention.

FIG. 18 is a schematic cross sectional view showing a lead end grid array semiconductor package 10*g* employing a modified grid array type lead frame of FIGS. 5A and 5B, free of a semiconductor chip pad, according to a ninth preferred embodiment of the present invention. Its basic structure is substantially the same as in the above-illustrated cases. Thus, a description will be given of the difference therebetween, below.

As seen in FIG. 18, bond pads 25 for signal input and output are arranged beneath and at the central region of a semiconductor ship 20 and electrically connected with leads by bond wires 30.

The grid array type lead frame, used for the lead end grid array semiconductor package 10*g* according to the ninth preferred embodiment of the present invention, is generally similar to that 1*b* of FIG. 5B but neither tie bars 6 nor a semiconductor chip supported by them exist. Another difference is that the leads 2 (only side faces are depicted in FIG. 18) having no identical plane direction-converting lead part and the leads 2 (front faces are depicted in FIG. 18) having identical plane direction-converting lead parts that are located at the central region and at the peripheral region of the lower panel of the semiconductor package 10, respectively, both are bent 4-times in a step pattern.

It should be noted in the lead end grid array semiconductor package according to the ninth embodiment of the present invention that a plastic encapsulating part 40 is formed not on and beside but beneath the semiconductor chip 20 so that the area of the semiconductor package 10*g* is as large as that of the semiconductor chip 20, thereby accomplishing the minimization of semiconductor package area.

It is a matter of course that the various grid array type lead frames which are within the scope of the present invention, including those used for the first to the eighth embodiments of the present invention, can be applied for the lead end grid array semiconductor package 10*g* identical in area to a semiconductor chip, according to the ninth preferred embodiment of the present invention. In addition, bumps or solder joints, instead of the bond wires, can be used as the electrical connecting means, which is also within the scope of the present invention.

Figure 19:
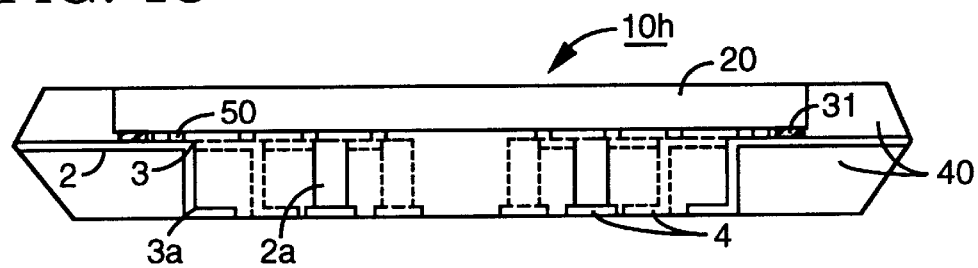
FIG. 19 is a schematic cross sectional view showing a lead end grid array semiconductor package employing a modification of the grid array type lead frame of FIGS. 5A and 5B, in accordance with a tenth preferred embodiment of the present invention.

FIG. 19 is a schematic cross sectional view showing a lead end grid array semiconductor package 10*h* employing a modified grid array type lead frame of FIGS. 5A and 5B, free of a semiconductor chip pad, according to a tenth preferred embodiment of the present invention. Its basic structure is substantially the same as in FIG. 11C. The only difference is that a plastic encapsulating part 40 is formed so as to encapsulate the side and the lower parts of a semiconductor chip 20 but not the upper part thereof. This structure may contribute to the efficiency of the emission of the heat generated during operation of the semiconductor chip 20.

It is a matter of course that the various grid array type lead frames which are within the scope of the present invention, including those used for the first to the eighth embodiments of the present invention, can be applied for the lead end grid array semiconductor package 10*g* identical in area to a semiconductor chip, according to the ninth preferred embodiment of the present invention. In addition, bond wires, instead of bumps or solder joints 31, can be used as the electrical connecting means, which is also within the scope of the present invention.

Also, it should be noted that the employment of the various grid array type lead frames with or without a semiconductor chip pad 5 is just an option depending on necessity.

Figure 20:
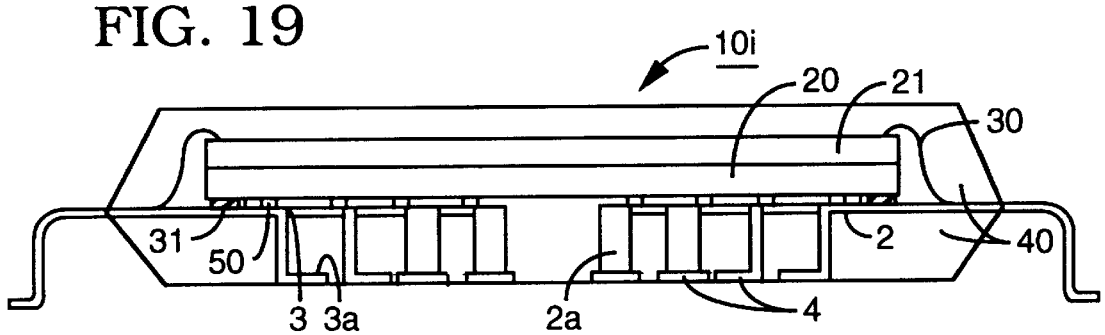
FIG. 20 is a schematic cross sectional view showing a lead end grid array semiconductor package employing a modification of the grid array type lead frame of FIGS. 5A and 5B, in accordance with an eleventh preferred embodiment of the present invention.

FIG. 20 is a schematic cross sectional view showing a lead end grid array semiconductor package 10*i* employing a modified grid array type lead frame 1*b* of FIGS. 5A and 5B, free of a semiconductor chip pad, according to a eleventh preferred embodiment of the present invention. Its basic structure is substantially the same as those of FIGS. 11A, and 11C. Thus, a description will be given of the difference there between, below.

In the semiconductor package 10*i* according to the eleventh embodiment of the present invention, a first semiconductor chip 20 is mounted on a grid array lead frame, followed by mounting a second semiconductor chip 21 on the first semiconductor chip 20. While a group of bond pads (not shown) are formed beneath the first semiconductor chip 20 and electrically connected with predetermined leads 2 by bumps or solder joints 31, another group of bond pads (not shown) are formed on the second semiconductor chip 21 and electrically connected with predetermined leads 2 by bond wires 30, so that the performance of the semiconductor package 10*i* is enhanced two-fold. If necessary, a semiconductor package may be obtained in which at least two semiconductor chips may be laminated and it is also within the scope of the present invention.

The end of the lead 2, opposite to the lead end 4, is extended to the outside of the plastic encapsulating part and bent into the form of a seagull's wing, in order to increase the efficiency of heat emission during the operation of the semiconductor chips 20 and 21 as well as to enhance security and stability upon mounting the semiconductor package on a mother board (not shown). In addition, the opposite end of the lead can be bent in the form of a "J" character with the bending part thereof fused with large or small solder balls. In addition, the opposite end of the lead extending to the outside of the plastic encapsulating part 40 may be made into various forms, and such selection is optional.

It is a matter of course that the various grid array type lead frames which are within the scope of the present invention, including those used for the first to the eighth embodiments of the present invention, can be applied for the lead end grid array semiconductor package according to the eleventh preferred embodiment of the present invention, which is also within the scope of the present invention.

Figure 21:
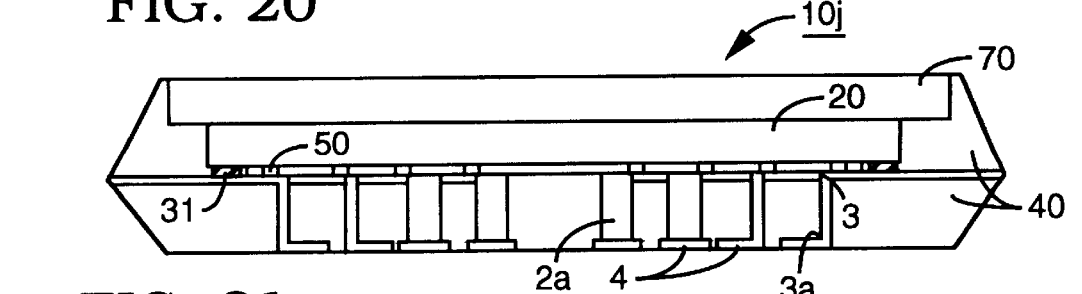
FIG. 21 is a schematic cross sectional view showing a lead end grid array semiconductor package employing a modification of the grid array type lead frame of FIGS. 5A and 5B, in accordance with a twelfth preferred embodiment of the present invention.
Figure 22A:
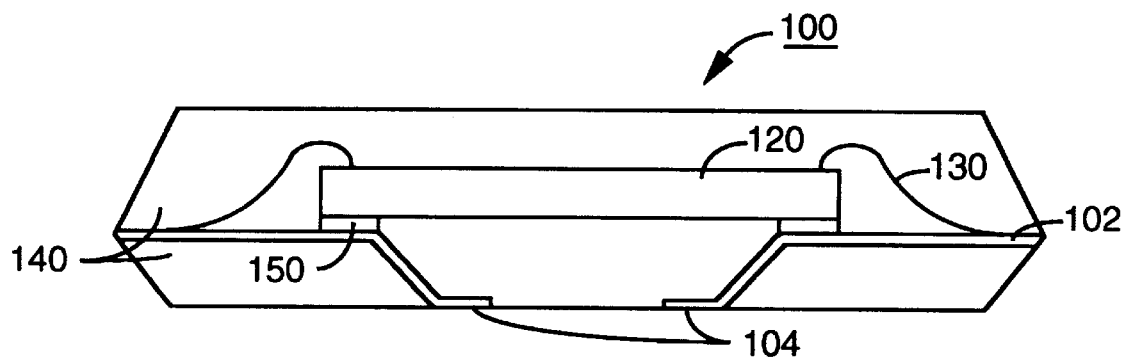
FIGS. 22A and 22B are a cross sectional view showing a conventional bottom lead type plastic package and a bottom view showing an array of the leads protruded from the bottom of the package, respectively.
Figure 22B:
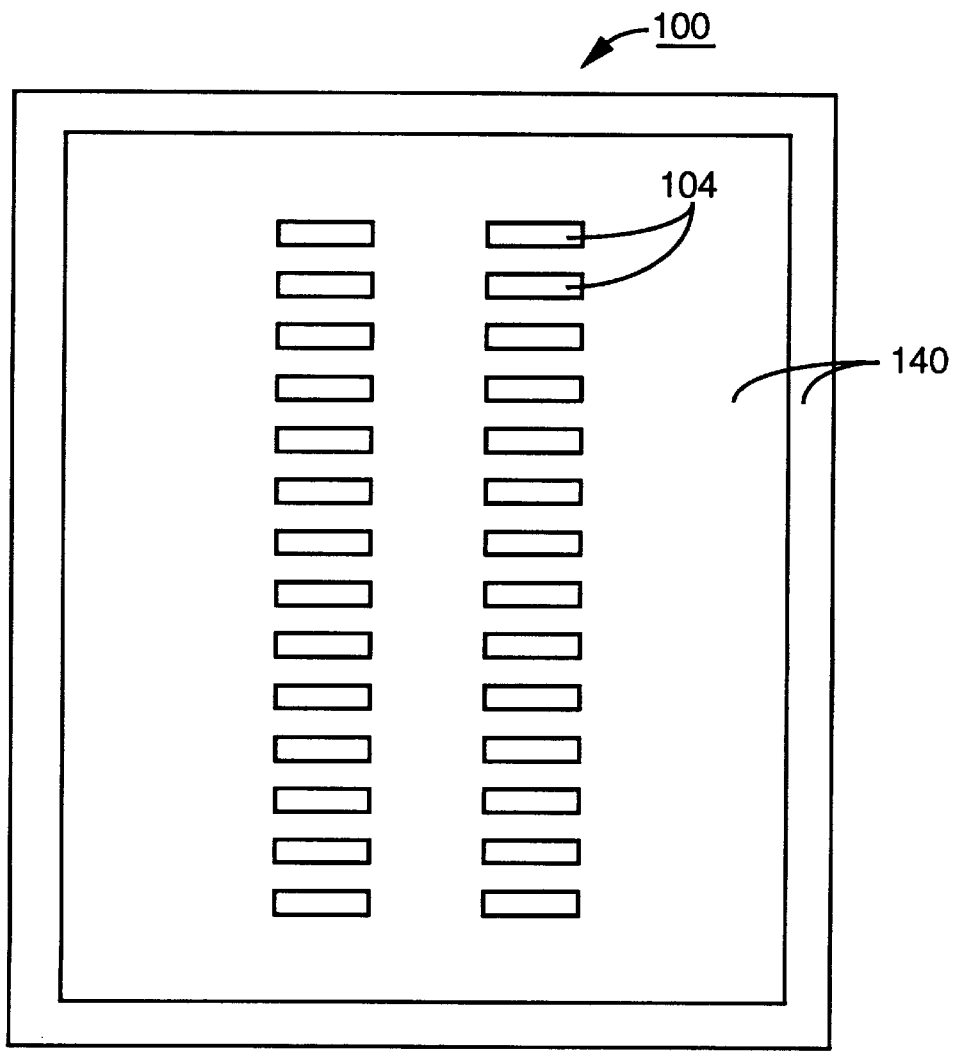
Figure 23A:
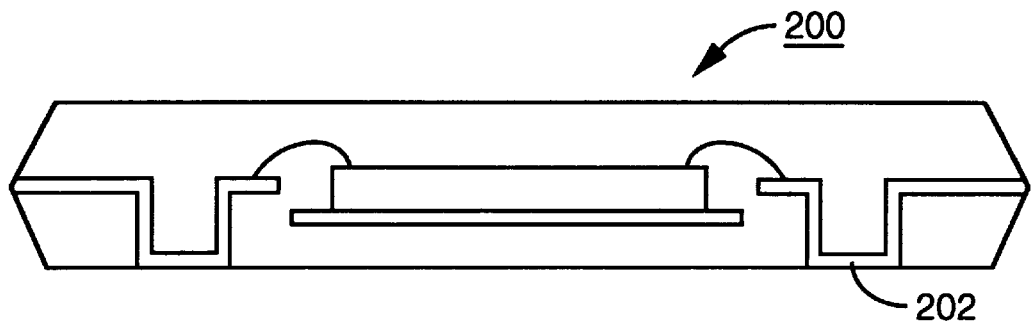
FIGS. 23A and 23B are a cross sectional view showing a conventional lead bottom exposure type quad flat semiconductor package and a bottom view showing an array of the leads protruded from the bottom of the package, respectively.
Figure 23B:
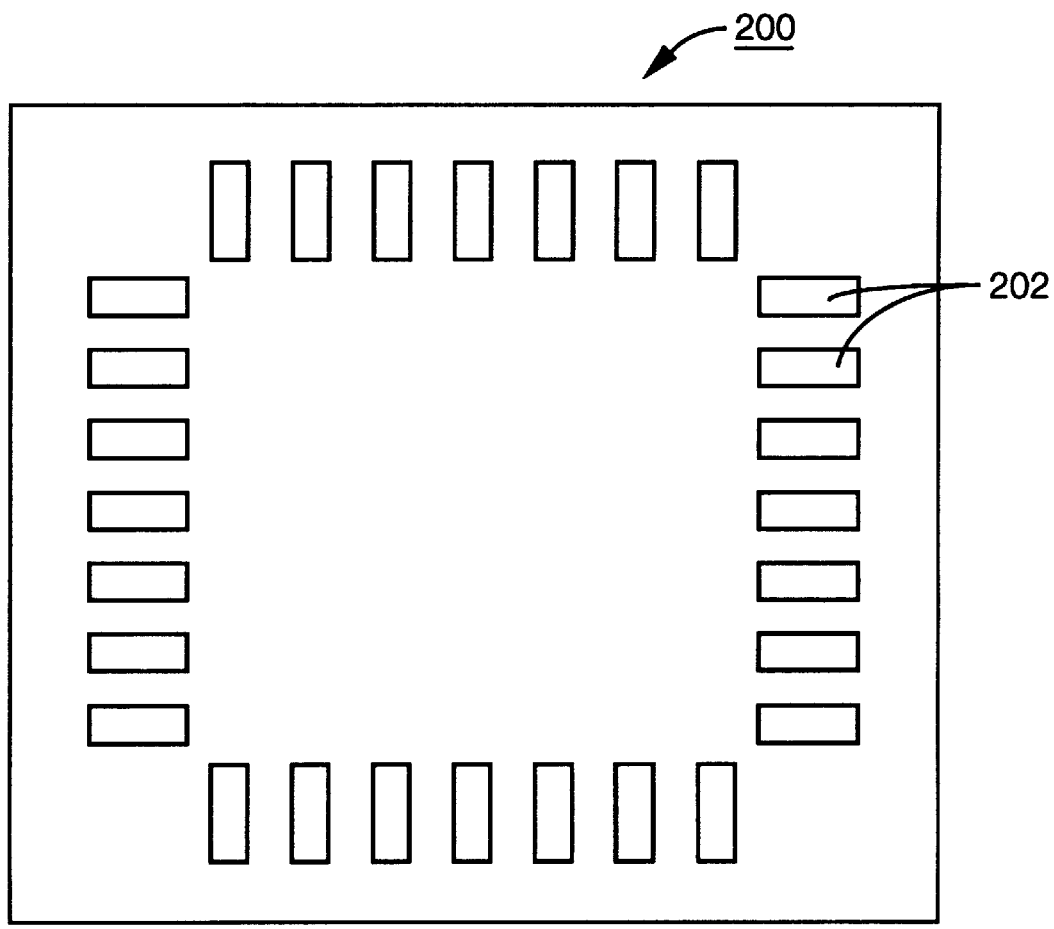

FIG. 21 is a schematic cross sectional view showing a lead end grid array semiconductor package 103 employing a modified grid array type lead frame 1*b* of FIGS. 5A and 5B, free of a semiconductor chip pad, according to a twelfth preferred embodiment of the present invention. Its basic structure is substantially the same as that 10 of FIGS. 11A. Thus, a description will be given of the difference therebetween, below.

In the lead end grid array semiconductor package 10 according to the twelfth preferred embodiment of the present invention, as shown in FIG. 21, bond pads (not shown) for signal output and input are formed beneath a semiconductor chip and electrically connected with leads 2 by bumps or solder joints 31. On the semiconductor chip 20 is mounted a heat sink 70 the upper surface of which is exposed to the exterior in order to efficiently emit heat.

It is a matter of course that the various grid array type lead frames which are subject to the present invention, including those used for the first to the eighth embodiments of the present invention, can be applied for the lead end grid array semiconductor package according to the twelfth preferred embodiment of the present invention, which is also within the scope of the present invention.

It is preferred that the sites of leads which are electrically connected to the bond pads for signal input and output by connection means, such as bumps or bond wires, are coated with silver or platinum to reduce electric resistance, in the lead end grid array semiconductor packages 10*a*, 10B, 10, 10', 10", 10*a*–10*j*. The surfaces of the lead ends used as pins for signal input and output in the semiconductor package mounted on a mother board, are also preferred to be coated with platinum or palladium for the same reason as well as for the reason of high connection strength.

As described hereinbefore, the grid array type lead frames according to the first to the seventh preferred embodiments of the present invention or to the non-limiting modifications thereof, each has a predetermined number of leads in which at least one identical plane direction-converting lead part and/or different plane direction-converting lead part is formed by at least one bending part, said leads extending to lead ends which are positioned on the same plane below the semiconductor chip-mounting region, forming a grid array. They are employed in the grid end grid array semiconductor packages in accordance with the first to the twelfth preferred embodiments of the present invention. The packages are very advantageous in many aspects: the area of the package can be formed to be as small as or similar to that of semiconductor chip; with a broad space away from a neighboring one, the exposed lead ends can be increased in the number per area. Broader space between the exposed lead ends can be secured when the grid array type lead frame in which the lead ends are distributed in a partially or fully alternate pattern is used; and by virtue of the broad space, a signal interference to which a noise is attributed can be significantly reduced, which results in transmitting signals at high speed. In addition, the present invention is economically favorable because an expensive circuit board, such as that used for ball grid array semiconductor package, can be avoided. Furthermore, the fabrication of the grid array type lead frame can be relatively easily accomplished, contributing to the fabrication yield of the package. Thus, while there have been described what are presently believed to be the preferred embodiments of the present invention, those skilled in the art will appreciate that other and further embodiments can be made without departing from the spirit of the invention and it is intended to include all such further modifications and changes as come within the true scope of the claims as set forth herein.

What is claimed is:

1. A grid array type lead frame, comprising:
    a side rail;
    a plurality of leads supported by the side rail and classified into at least two groups by length;
    at least one different plane direction-converting lead part formed in each of the leads by at least one bending part; and
    a plurality of lead ends to which the leads extend, said lead ends being located on one lower plane corresponding to a semiconductor chip-mounting region, with a formation of a grid array.

2. A grid array type lead frame as set forth in claim 1, wherein the leads of at least one group each have at least one identical plane direction-converting lead part.

3. A grid array type lead frame as set forth in claim 1 or 2, wherein the lead ends of the leads classified into at least two groups by length form a partially or fully alternating grid array which consists of at least three alternating lines and at least three alternating rows.

4. A grid array type lead frame as set forth in claim 1 or 2, wherein the number of the bending parts formed in the leads is set to be the same or different from one group to another, in part or in total.

5. A grid array type lead frame as set forth in claim 4, wherein the number of the bending parts is the same or different throughout the leads of each group, in total or in part.

6. A grid array type lead frame as set forth in claim 4, wherein the identical plane direction-converting lead part is formed in the leads of at least two groups and the number of the identical plane direction-converting lead part is set to be the same or different from one group to another, in part or in total.

7. A grid array type lead frame as set forth in claim 6, wherein the number of the identical plane direction lead part is the same or different throughout the leads of each group, in total or in part.

8. A grid array type lead frame as set forth in claim 1 or 2, wherein the leads are interconnected with at least two neighboring ones through at least one lead connecting part.

9. A grid array type lead frame as set forth in claim 1 or 2, wherein all of the leads are bent to two directions of X and Z axes or Y and Z axes or to three directions of X, Y and Z axes, extending to the respective lead ends.

10. A grid array type lead frame as set forth in claim 2, wherein the identical plane direction-converting lead part is directed to at least one axis selected from XY axis, X axis and Y axis.

11. A grid array type lead frame as set forth in claim 1 or 2, wherein the leads all are connected perpendicularly to and supported by dambars.

12. A grid array type lead frame as set forth in claim 1 or 2, wherein the leads each are bent in a downward direction by a first bending part and extended to the same direction as before the bending by a second bending part.

13. A grid array type lead frame as set forth in claim 12, wherein the first bending parts in all of the leads are positioned at the same distance away from the dambars and the second bending parts are formed near the first bending parts at the same distance away from the dambar.

14. A grid array type lead frame as set forth in claim 1 or 2, wherein the leads end each are formed into an expanded square form wider than the leads.

15. A grid array type lead frame as set forth in claim 14, wherein each of the lead ends has a cylindrical lead end prominence at its bottom, which can be used as an input and output terminal.

16. A grid array type lead frame as set forth in claim 15, wherein the lead end has at least one lead end tip formed beside at least one side of the lead end including the side to the direction of which the lead extends.

17. A grid array type lead frame as set forth in claim 15, wherein the lead end prominences form a grid array which consists of at least three alternating lines and at least three alternating rows.

18. A grid array type lead frame as set forth in claim 1 or 2, wherein the lead frame further comprises a semiconductor chip pad set.

19. A grid array type lead frame as set forth in claim 18, wherein the semiconductor chip pad set consists of a plurality of square pads and a plurality of rectangular pads, both being interconnected in a line by a supporting member.

20. A grid array type lead frame as set forth in claim 19, wherein the rectangular pads are connected through a tie bar to the dambar, said tie bar being bent in the same patterns as those accomplished by the first and the second bending parts.

21. A grid array type lead frame as set forth in claim 19, wherein the square pads and the rectangular pads have heat emission prominences at their bottoms.

22. A grid array type lead frame as set forth in claim 18, wherein the semiconductor chip pad set comprises at least two semiconductor chip pads smaller in area than the semiconductor chip, at the opposite sides of the lead frame.

23. A grid array type lead frame as set forth in claim 18, wherein the semiconductor chip pad set comprises at least one pad smaller in area than the semiconductor chip, said pad being positioned at the central region of the lead frame and supported by tie bar.

24. A grid array type lead frame as set forth in claim 1 or 2, wherein the lead frame further comprises a guide for introducing an encapsulating resin liquid, at least one corner.

25. A grid array type lead frame as set forth in claim 24, wherein two leads, each extending from a side, are connected with each other to form one lead end at each corner.

26. A grid array type lead frame as set forth in claim 1, wherein the leads are classified into groups by length, with an extension direction of X axis or Y axis, each of the leads with an extension direction of X axis being sequentially bent to Z axis downward direction, X axis direction and Z axis direction by a first, a second and a third bending parts, respectively so that it extends in a step pattern, each of the leads with extension direction of Y axis being sequentially bent to Z axis downward direction, Y axis direction and Z axis downward direction by a first, a second and a third bending parts, respectively so that they extend in a step pattern.

27. A grid array type lead frame as set forth in claim 2, wherein the leads are classified into groups by length and alternately arrayed with an extension direction of X axis or Y axis, the leads with an extension direction of X axis being subject to either relatively long groups having identical plane Y axis direction-converting lead parts, in which the leads each are sequentially bent to Z axis downward direction and Y axis direction by a first and a second bending parts, respectively, or relatively short groups having no identical plane Y axis direction-converting lead parts, in which the leads each are sequentially bent to Z axis downward direction and X axis direction by a first and a second bending parts, respectively, and the leads with an extension direction of Y axis each being sequentially bent to Z axis downward direction and Y axis direction by a first and a second bending parts, respectively.

28. A grid array type lead frame as set forth in claim 27, wherein the leads with an extension direction of X axis, each having no identical plane Y axis direction-converting lead part, are slant bent to XZ axis direction by the first bending part, and the other leads with an extension direction of X axis, each having an identical plane Y axis direction-converting lead part and the leads with an extension direction of Y axis are both slant bent to YZ axis direction by the first bending parts.

29. A grid array type lead frame as set forth in claim 1, wherein the leads are classified into groups by length and alternately arrayed with an extension direction of X axis or Y axis, the leads with an extension direction of X axis being subject to either relatively long groups in which the leads each are sequentially bent to Z axis downward direction, Y axis direction and Z axis downward direction by a first, a second and a third bending parts, respectively, or relatively short groups in which the leads each are sequentially bent to Z axis downward direction, X axis direction and Z axis . downward direction by a first, a second and a third bending parts, respectively, so that they extend in step patterns, and the leads with an extension direction of Y axis each being sequentially bent to Z axis downward direction, Y axis direction and Z axis downward direction by a first, a second and a third bending parts, respectively, so that they extend in step patterns.

30. A grid array type lead frame as set forth in one of claims 26 to 29, further comprising a semiconductor chip pad smaller in area than the semiconductor chip which is supported by the tie bar at the central region of the lead frame, the lead ends forming a grid array on one lower plane except for the region corresponding to the semiconductor chip pad.

31. A grid array type lead frame as set forth in claim 27 or 28, wherein the lead ends are each formed into expanded planar forms which are wider than the leads and parallel to the lead frame.

32. A grid array type lead frame as set forth in claim 1, wherein the leads are classified into groups by length and alternately arrayed with an extension direction of X axis or Y axis, the leads with an extension direction of X axis being subject to either relatively long groups in which the leads each are sequentially bent to Z axis downward direction, Y axis direction, Z axis upward direction, Y axis direction and Z axis downward direction by a first to a fifth bending parts, respectively, so that they extend in fallen "S" character patterns, or relatively short groups or the longest group in which the leads each are sequentially bent to Z axis downward direction, X axis direction, Z axis upward direction, X axis direction and Z axis downward direction by a first to fifth bending parts, respectively, so that they extend in fallen "S" character patterns, and the leads with an extension direction of Y axis each being sequentially bent to Z axis downward direction, Y axis direction, Z axis upward direction, and Y axis direction and Z axis downward direction by a first to a fifth bending parts, respectively, so that they extend in a fallen "S" character pattern.

33. A grid array type lead frame as set forth in claim 32, wherein the leads subject to the longest group with an extension direction of X axis and the leads subject to the longest group with an extension direction of Y axis both extend below the central part of the lead frame.

34. A grid array type lead frame as set forth in claim 32 or 33, wherein the leads ends and the X axis or Y axis different plane direction-converting lead parts between the two different plane direction-converting lead parts formed by the bending to downward and upward Z axis are positioned on one lower plane corresponding to the semiconductor chip-mounting region.

* * * * *